(12) United States Patent
Pandya et al.

(10) Patent No.: US 12,213,260 B2
(45) Date of Patent: *Jan. 28, 2025

(54) ELECTRONIC DEVICE

(71) Applicant: Apple Inc., Cupertino, CA (US)

(72) Inventors: Sameer Pandya, Sunnyvale, CA (US);
Dakota A. Bass, Foster City, CA (US);
Daniel J. Barrett, Redwood City, CA (US); Erik G. de Jong, San Francisco, CA (US); Xuan Liu, Santa Clara, CA (US); Kiran S. Pillai, San Bruno, CA (US); Mario Martinis, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 347 days.

This patent is subject to a terminal disclaimer.

(21) Appl. No.: 17/447,561

(22) Filed: Sep. 13, 2021

(65) Prior Publication Data
US 2022/0272849 A1 Aug. 25, 2022

Related U.S. Application Data

(60) Provisional application No. 63/153,865, filed on Feb. 25, 2021.

(51) Int. Cl.
H05K 5/00 (2006.01)
H05K 5/02 (2006.01)
H05K 7/14 (2006.01)

(52) U.S. Cl.
CPC ......... *H05K 5/0017* (2013.01); *H05K 5/0086* (2013.01); *H05K 5/0217* (2013.01); *H05K 7/1427* (2013.01)

(58) Field of Classification Search
CPC .. H05K 5/0017; H05K 5/0086; H05K 5/0217; H05K 7/1427; H05K 5/02;
(Continued)

(56) References Cited

U.S. PATENT DOCUMENTS 8,587,935 B2 * 11/2013 Lee ................... G02F 1/133308
361/679.02
2011/0116220 A1 * 5/2011 Lee ................... G02F 1/133308
361/679.02
(Continued)

FOREIGN PATENT DOCUMENTS

CN 107003774 A 8/2017
CN 109074190 A 12/2018
(Continued)

OTHER PUBLICATIONS

European Search Report for EP Application No. 21211152.0, mailed May 3, 2022 (7 pp.).

*Primary Examiner* — Sagar Shrestha

(74) *Attorney, Agent, or Firm* — Dorsey & Whitney LLP

(57) ABSTRACT

A portable or wearable electronic device can include a device housing defining an internal volume, and an electronic component disposed in the internal volume. The electronic component can be an input component and can have a component housing. The electronic device can also include an antenna feed assembly disposed in the internal volume. The antenna feed assembly can include a conductive grounding component electrically connected to the component housing and the device housing, and an antenna feed component electrically connected to the grounding component and disposed adjacent to the component housing. The conductive grounding component can surround a first major surface and a second major surface of the component housing.

13 Claims, 32 Drawing Sheets

(58) Field of Classification Search
CPC .... H05K 5/03; H04M 1/724095; H04M 1/0202; G06F 1/163; H01Q 1/22; H01Q 1/48; H01Q 1/50
See application file for complete search history.

(56) References Cited

U.S. PATENT DOCUMENTS

| | | | | |
|---|---|---|---|---|
| 2016/0079663 A1* | 3/2016 | Youm | ................... | H01Q 1/243 343/702 |
| 2016/0218166 A1 | 7/2016 | Fukuma et al. | | |
| 2017/0214422 A1 | 7/2017 | Na et al. | | |
| 2017/0367190 A1* | 12/2017 | Drzaic | ................... | G09G 3/20 |
| 2018/0081481 A1* | 3/2018 | Fournier | ............ | H05K 7/20963 |
| 2018/0084680 A1* | 3/2018 | Jarvis | ................... | H05K 1/148 |
| 2018/0196300 A1* | 7/2018 | Jung | ................. | G02F 1/133308 |
| 2019/0081387 A1 | 3/2019 | Pandya et al. | | |
| 2019/0081694 A1 | 3/2019 | Zhou et al. | | |
| 2019/0096913 A1* | 3/2019 | Lee | ........................ | H10K 50/86 |
| 2019/0125377 A1 | 5/2019 | Shelton | | |
| 2019/0259818 A1 | 8/2019 | Jeon et al. | | |
| 2020/0029475 A1 | 1/2020 | Park et al. | | |
| 2020/0057472 A1* | 2/2020 | Kang | ................... | G06F 1/1601 |
| 2020/0092407 A1* | 3/2020 | Fournier | ............... | G06F 1/1637 |
| 2020/0196496 A1* | 6/2020 | Shin | ...................... | G06F 1/1652 |
| 2020/0205307 A1* | 6/2020 | Hooton | .................. | B23P 13/02 |
| 2020/0326582 A1* | 10/2020 | Azuma | ................. | G06F 1/1601 |
| 2021/0405688 A1* | 12/2021 | Barrett | .................... | G06F 1/163 |
| 2022/0197226 A1* | 6/2022 | Yang | ..................... | G04R 60/06 |
| 2022/0210933 A1* | 6/2022 | Park | ...................... | G06F 1/1637 |
| 2022/0312607 A1* | 9/2022 | Bass | ..................... | G06F 1/1656 |

FOREIGN PATENT DOCUMENTS

| | | |
|---|---|---|
| CN | 109495611 A | 3/2019 |
| DE | 102013201358 A1 | 7/2014 |
| WO | 2016104933 A1 | 6/2016 |
| WO | 2018057652 A1 | 3/2018 |

* cited by examiner

ELECTRONIC DEVICE

CROSS-REFERENCE TO RELATED APPLICATION(S)

This claims priority to U.S. Provisional Patent Application No. 63/153,865, filed 25 Feb. 2021, and entitled "ELECTRONIC DEVICE," the entire disclosure of which is hereby incorporated by reference.

FIELD

The described embodiments relate generally to electronic devices. More particularly, the present embodiments relate to wearable electronic devices.

BACKGROUND

Electronic devices are increasingly being designed with device portability in mind, for example, to allow users to use these devices in a wide variety of situations and environments. In the context of wearable devices, these devices can be designed to include many different functionalities and to be operated in many different locations and environments. The components of an electronic device, for example, the processors, memory, antennas, display, and other components can partially determine a level of performance of the electronic device. Further, the arrangement of these components with respect to one another in the device can also determine the level of performance of the electronic device.

Continued advances in electronic devices and their components have enabled considerable increases in performance. Existing components and structures for electronic devices can, however, limit the levels of performance of such devices. For example, while some components can achieve high levels of performance in some situations, the inclusion of multiple components in devices sized to enhance portability can limit the performance of the components, and thus, the performance of the device. Consequently, further tailoring and arrangement of components for electronic devices to provide additional or enhanced functionality, without introducing or increasing undesirable device properties, can be desirable.

SUMMARY

According to some aspects of the present disclosure, a portable electronic device can include a device housing defining an internal volume, an electronic component at least partially disposed in the internal volume, the electronic component including a component housing, and an antenna feed assembly. The antenna feed assembly can include a conductive grounding component electrically connected to the component housing and the device housing, the conductive grounding component at least partially surrounding a first major surface and a second major surface of the component housing, and an antenna feed component electrically connected to the conductive grounding component and disposed adjacent to the component housing.

In some examples, the portable electronic device can further include a processor disposed in the internal volume, and a flexible electrical connector coupled to the antenna feed component and the processor. The portable electronic device can further include a display assembly at least partially disposed in the internal volume, the display assembly including a display layer defining an active area, and a resonating element electrically connected to the antenna feed component. The device housing includes a sidewall, and the electronic device further includes an adjustable grounding component moveably attached to the sidewall, the adjustable grounding component electrically connected to the sidewall and the resonating element. The antenna feed assembly can be a first antenna feed assembly, and the electronic device can include a second antenna feed assembly positioned in the internal volume opposite the first antenna feed assembly. At least one of the first antenna feed assembly and the second antenna feed assembly can be configured to selectively drive a resonating element at one or more desired frequencies, or act as an electrical ground for the resonating element. The first antenna feed assembly can be configured to drive a resonating element at one or more frequencies selected from a first band of frequencies, and the second antenna feed assembly can be configured to drive the resonating element at one or more frequencies selected from a second band of frequencies that are lower than the first band of frequencies. The electronic component can include a user input component. The electronic component can be a first electronic component, and the electronic device further includes a second electronic component positioned adjacent to the first electronic component and electrically connected to the grounding component. The conductive grounding component can include copper.

According to some aspects, a portable electronic device can include a housing at least partially defining an internal volume and an exterior surface, and a display assembly at least partially disposed in the internal volume, the display assembly can include a display layer defining an active area, a flexible tail extending from the display layer, the flexible tail defining a bend region, an insulating material at least partially surrounding the display layer, the insulating material at least partially defining the exterior surface and including at least a portion of the flexible tail embedded therein, and a transparent cover overlaying the display assembly.

In some examples, the portable electronic device can further include an antenna radiating element at least partially embedded in the insulating material. The insulating material can include a first portion and a second portion affixed to the housing, the first portion having a lower Young's modulus than the second portion. A portion of the insulating material that defines the exterior surface can be positioned between the transparent cover and a sidewall of the housing. The housing can include a sidewall that defines a slot, and a portion of the insulating material that defines the exterior surface can be disposed in the slot. A portion of the exterior surface defined by the insulating material can be flush with a portion of the exterior surface defined by the housing.

According to some aspects, a display assembly for an electronic device can include a display layer defining an active area, a printed circuit board disposed opposite the display layer, the printed circuit board defining a major surface can have a width greater than or equal to a width of the display layer, a flexible tail extending from the display layer and connected to the printed circuit board, the flexible tail defining a bend region, and an insulating material disposed adjacent to a periphery of the major surface of the printed circuit board, the insulating material can be least partially surrounding the flexible tail.

In some examples, the flexible tail can be flush with the major surface of the printed circuit board at a periphery thereof. The display assembly can further include a conductive adhesive disposed adjacent to at least a portion of a periphery of the major surface and electrically connected to the printed circuit board. The display assembly can further include a conductive layer electrically connected to the printed circuit board and disposed adjacent to at least a portion of a periphery of the major surface, the conductive layer defining a gap, and a portion of the flexible tail connected to the printed circuit board can be disposed in the gap.

BRIEF DESCRIPTION OF THE DRAWINGS

The disclosure will be readily understood by the following detailed description in conjunction with the accompanying drawings, wherein like reference numerals designate like structural elements, and in which:

FIG. 3I shows a perspective view of a portion of a component of an electronic device.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The architecture and components of the electronic devices described herein can allow for configurations and designs that can maximize the available space or volume in an internal volume defined by a housing of the device that is available to be occupied by one or more components. For example, certain aspects of device performance, such as battery life, can be improved by increasing the size or volume of the battery of the device. Additionally, or alternatively, the device itself could be reduced in size while achieving similar or even improved levels of performance.

In addition to saving space or providing other useful or desirable features, the architectures and components described herein can also present challenges to traditional techniques for grounding or tuning antennas present in the device. Accordingly, the devices and components described herein can include configurations and features that allow for the optimization and improvement of the performance of one or more antennas contained in such a device. For example, one or more components can act as both operational components and antenna radiating elements. The grounding of various components of the device, as well as the antennas, can also be controlled, tuned, or designed in order to achieve desired levels of performance.

These and other embodiments are discussed below with reference to FIGS. 1A-10. However, those skilled in the art will readily appreciate that the detailed description given herein with respect to these Figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

Figure 1A:
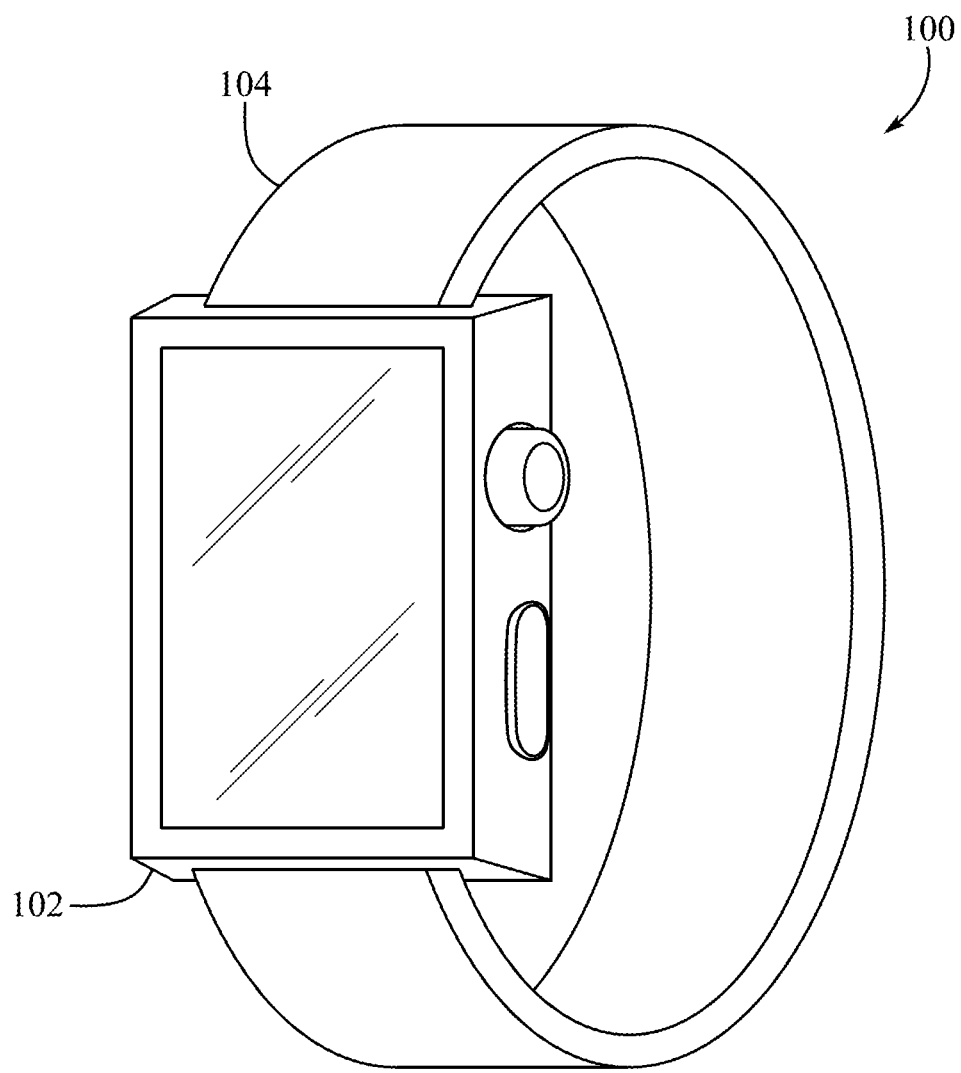
FIG. 1A shows a perspective view of an electronic device.

FIG. 1A shows an example of an electronic device 100. The electronic device shown in FIG. 1A is a watch, such as a smartwatch. The smartwatch of FIG. 1A is merely one representative example of a device that can be used in conjunction with the systems and methods disclosed herein. Electronic device 100 can correspond to any form of wearable electronic device, a portable media player, a media storage device, a portable digital assistant ("PDA"), a tablet computer, a computer, a mobile communication device, a GPS unit, a remote control device, or other electronic device. The electronic device 100 can be referred to as an electronic device, or a consumer device. In some examples, the electronic device 100 can include a housing 101 that can carry operational components, for example, in an internal volume at least partially defined by the housing. The electronic device 100 can also include a strap 103, or other retaining component that can secured the device 100 to a body of a user as desired. Further details of the electronic device are provided below with reference to FIG. 1B.

Figure 1B:
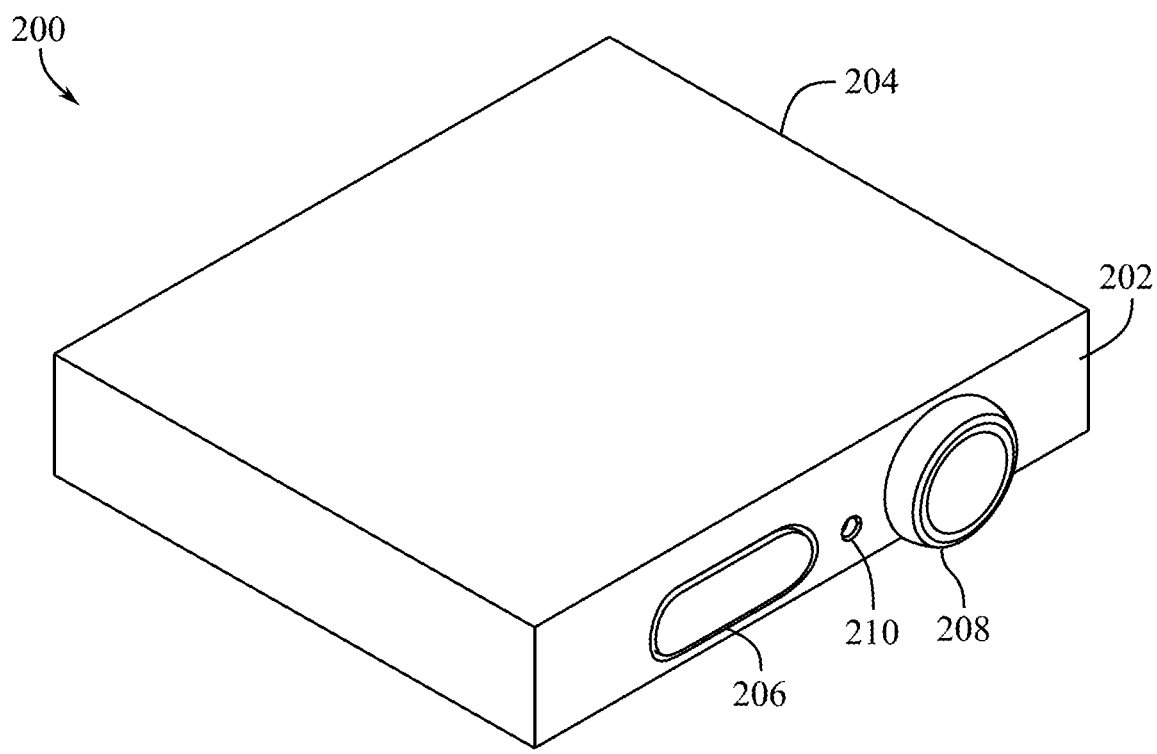
FIG. 1B shows a top perspective view of an electronic device.

FIG. 1B illustrates a smartwatch 200 that can be substantially similar to, and can include some or all of the features of the devices described herein, such as electronic device 100. The device 200 can include a housing 202, and a display assembly 204 attached to the housing. The housing 202 can substantially define at least a portion of an exterior surface of the device 200.

The display assembly 204 can include a glass, a plastic, or any other substantially transparent exterior layer, material, component, or assembly. The display assembly 204 can include multiple layers, with each layer providing a unique function, as described herein. Accordingly, the display assembly 204 can be, or can be a part of, an interface component. The display assembly 204 can define a front exterior surface of the device 200 and, as described herein, this exterior surface can be considered an interface surface. In some examples, the interface surface defined by display assembly 204 can receive inputs, such as touch inputs, from a user.

In some examples, the housing 202 can be a substantially continuous or unitary component and can define one or more openings to receive components of the electronic device 200. In some examples, the device 200 can include input components such as one or more buttons 206 and/or a crown 208 that can be disposed in the openings. In some examples, a material can be disposed between the buttons 206 and/or crown 208 and the housing 202 to provide an airtight and/or watertight seal at the locations of the openings. The housing 202 can also define one or more openings or apertures, such as aperture 210 that can allow for sound to pass into or out of the internal volume defined by the housing 202. For example, the aperture 210 can be in communication with a microphone component disposed in the internal volume. In some examples, the housing 202 can define or include a feature, such as an indentation to removably couple the housing 202 and a strap or retaining component.

Figure 1C:
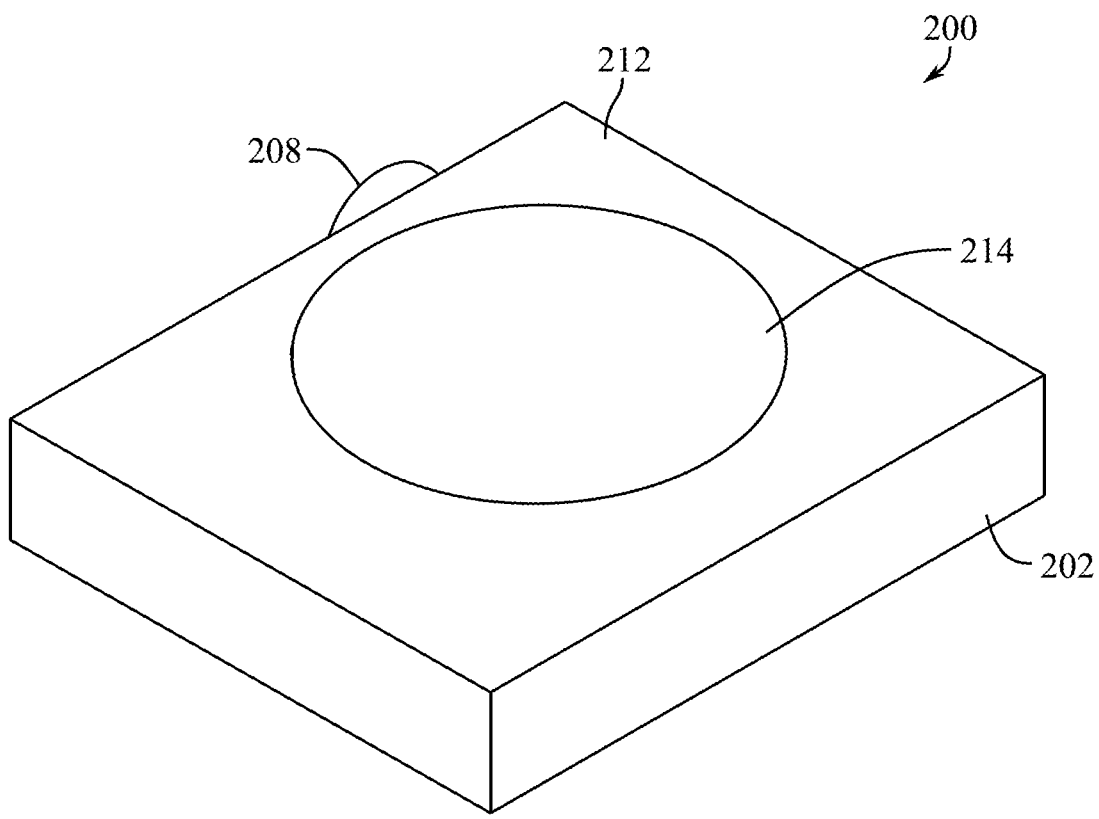
FIG. 1C shows a bottom perspective view of the electronic device of FIG. 1B.

FIG. 1C shows a bottom perspective view of the electronic device 200. The device 200 can include a back cover 212 that can be attached to the housing 202, for example, opposite the display assembly 204. The back cover 212 can include ceramic, plastic, metal, or combinations thereof. In some examples, the back cover 212 can include an at least partially electromagnetically transparent component 214. The electromagnetically transparent component 214 can be transparent to any desired wavelengths of electromagnetic radiation, such as visible light, infrared light, radio waves, or combinations thereof. In some examples, the electromagnetically transparent component 214 can allow sensors and/or emitters disposed in the housing 202 to communicate with the external environment. Together, the housing 202, display assembly 204 and back cover 212 can substantially define an internal volume and an external surface of the device 200.

Figure 1D:
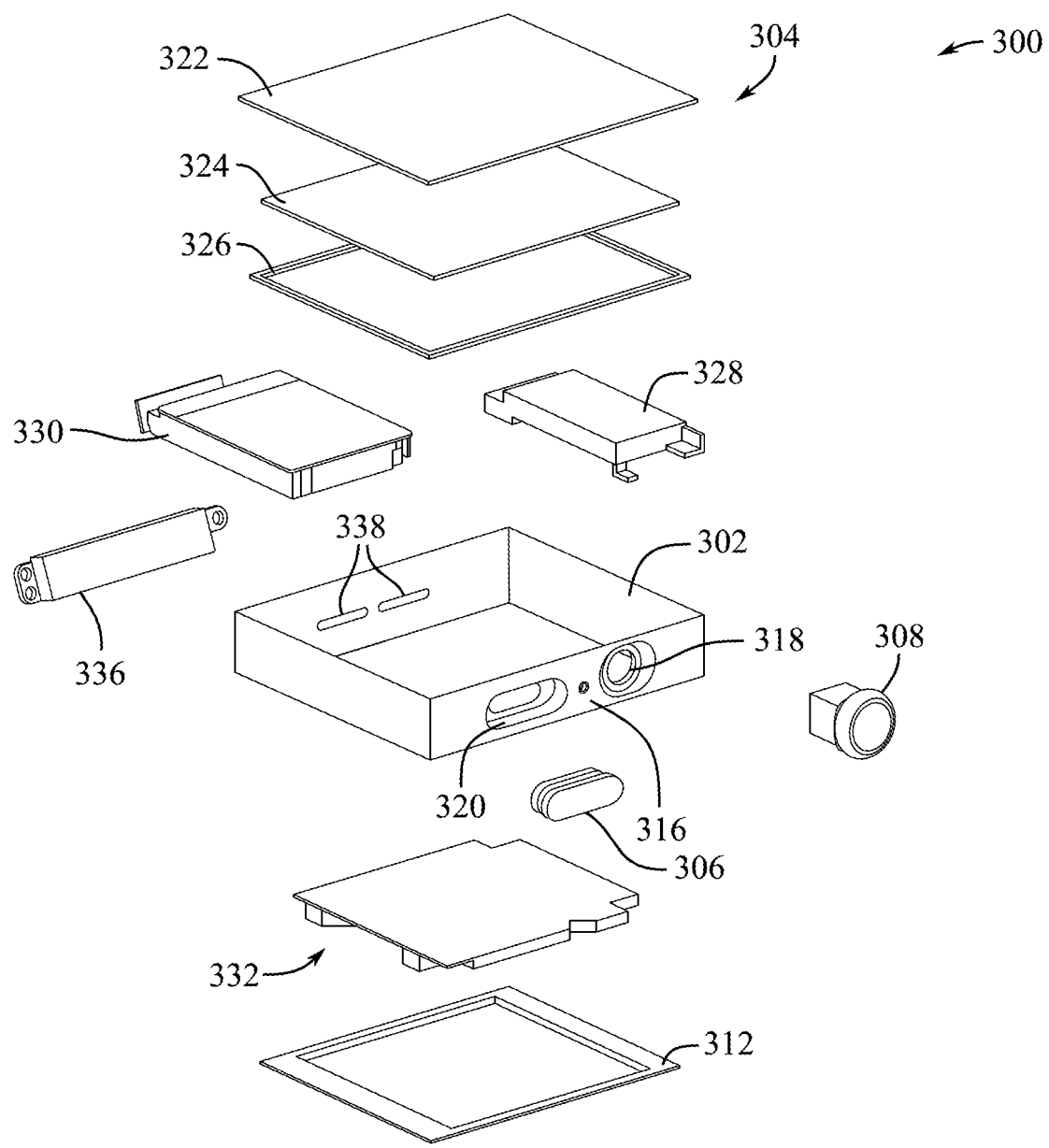
FIG. 1D shows an exploded view of an electronic device.

FIG. 1D illustrates an exploded view of a smartwatch 300 that can be substantially similar to, and can include some or all of the features of the devices described herein, such as electronic devices 100 and 200. The device 300 can include a housing 302, a display assembly 304, and a back cover 312. Together, the housing 302, display assembly 304, and back cover 312 can define an exterior surface and an internal volume of the device 300.

The housing 302 can be a substantially continuous or unitary component, and can define one or more openings 316, 338 to receive components of the electronic device 300 and/or to provide access to an internal portion of the electronic device 300. In some examples, the device 300 can include input components such as one or more buttons 306 and/or a crown 308 that can be disposed in the openings 318, 320.

The display assembly 304 can be received by and can be attached to the housing 302. The display assembly can include a cover including a transparent material, such as plastic, glass, and/or ceramic. The display assembly 304 can also include a display stack or display assembly that can include multiple layers and components, each of which can perform one or more desired functions. For example, the display stack can include a display layer 324 that can include a touch detection layer or component, a force sensitive layer or component, and one or more display layers or components that can include one or more pixels and/or light emitting portions to display visual content and/or information to a user. In some examples, the display layer or component 324 can include a liquid crystal display (LCD), a light emitting diode (LED) display, an organic light emitting diode (OLED) display, and/or any other form of display. The display layer 324 can also include one or more electrical connectors to provide signals and/or power to the display layer 324 from other components of the device 300.

In some examples, the device 300 can include a gasket or seal 326 that can be disposed between the display assembly 304 and the housing 302 to substantially define a barrier to the ingress of liquids or moisture into the internal volume from the external environment at the location of the seal 326. As described herein, the seal 326 can include polymer, metal, and/or ceramic materials. The device 300 can also include a seal 334 that can be disposed between the housing 302 and the back cover 312 to substantially define a barrier to the ingress of liquids or moisture into the internal volume from the external environment at the location of the seal 334. As described herein, the seal 334 can include polymer, metal, and/or ceramic materials. The seal 334 can be substantially similar to and can include some or all of the features of the seal 326.

The device 300 can also include internal components, such as a haptic engine 328, a battery 330, an audio module 336, and a logic board 332, also referred to as a main logic board 332 that can include a system in package (SiP) disposed thereon, including one or more integrated circuits, such as processors, sensors, and memory. The SiP can also include a package.

In some examples, the device 300 can include one or more wireless antennas that can be in electrical communication with one or more other components of the device 300. In some examples, one or more antennas can receive and/or transmit wireless signals at one or more frequencies and can be, for example, one or more of a cellular antenna such as an LTE antenna, a Wi-Fi antenna, a Bluetooth antenna, a GPS antenna, a multi-frequency antenna, and the like. The antenna or antennas can be communicatively coupled to one or more additional components of the electronic device 300. In some examples, one or more other components of the device 300 can include a portion or part of an antenna, such as a radiating element thereof.

The internal components can be disposed within the internal volume defined at least partially by the housing 302, and can be affixed to the housing 302 via adhesives, internal surfaces, attachment features, threaded connectors, studs, posts, or other features, that are formed into, defined by, or otherwise part of the housing 302 and/or the cover 322 and/or back cover 312.

Any number or variety of components in any of the configurations described herein can be included in an electronic device, as described herein. The components can include any combination of the features described herein, and can be arranged in any of the various configurations described herein. The structure and arrangement of components of a device, as well as the concepts regarding their use can apply not only to the specific examples discussed herein, but to any number of embodiments in any combination. Various examples of electronic devices and electronic device components including some having various features in various arrangements are described below, with reference to FIGS. 2A-5D.

Figure 2A:
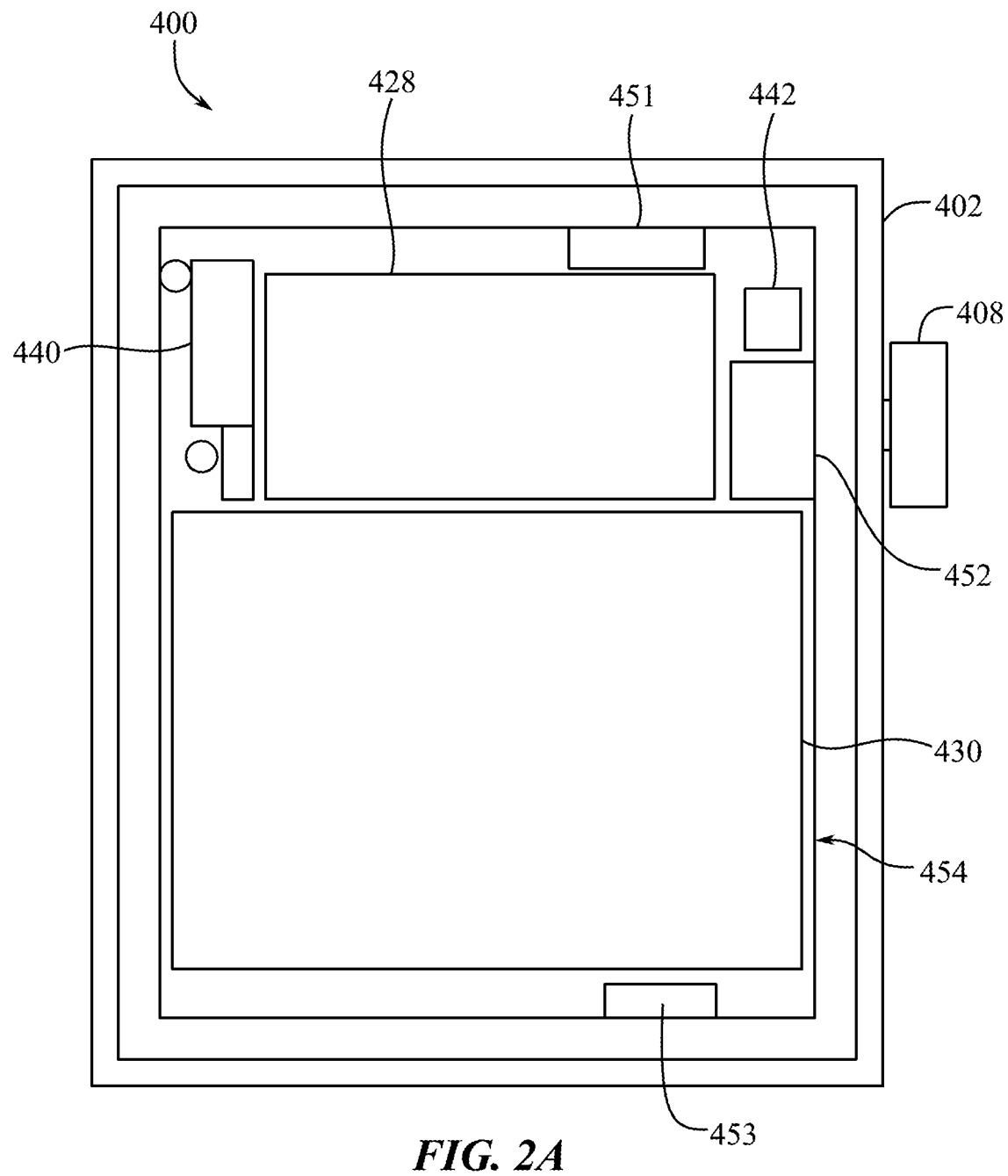
FIG. 2A shows a cross-sectional top view of an electronic device.

FIG. 2A shows a top cross-sectional view of an electronic device 400 that can be substantially similar to, and can include some or all of the features of the electronic devices described herein. In some examples, a housing 402 can define an internal volume with components contained therein. Several components have been omitted for simplicity, but the housing 402 can contain various electronic components, such as a battery 430, a haptic feedback module 428 positioned near or adjacent to the battery 430. The device 400 can include other electronic components, such as an input component, or crown 408. In some examples, the device 400 can include one or more antennas and the associated components necessary to send and/or receive signals through these antennas.

In some examples, the electronic device 400 shown in FIG. 2A, and any of the electronic devices described herein, can include one or more wireless antennas that can send and/or receive information at one or more frequencies or ranges of frequencies. For example, an electronic device 400 can include one or more antennas that can drive frequencies associated with one or more wireless network protocols. In some examples, one or more antennas of the device 400 can operate at cellular frequencies, LTE frequencies, 5G frequencies, Wi-Fi frequencies, ultra-wideband (UWB) frequencies, Bluetooth frequencies, GPS frequencies, and/or any other frequencies as desired. In some examples, one or more antennas of the device 400 can operate at frequencies between about 100 MHz and about 100 GHz, or between about 500 MHz and about 60 GHz.

In some examples, in order to provide for desired levels of antenna performance and efficiency over as wide a range of frequencies as desired, an antenna can be coupled or in communication with more than one antenna feed or antenna feed assembly. As shown in FIG. 2A, the device 400 can include a first antenna feed assembly 440 and a second antenna feed assembly 442. In some examples, the first antenna feed assembly 440 is configured to drive a resonating element or antenna at one or more frequencies selected from a first band of frequencies, while the second antenna feed assembly 442 is configured to drive the resonating element or antenna at one or more frequencies selected from a second band of frequencies that are different, such as higher or lower, than the first band of frequencies. In some examples, the antenna feed assemblies 440, 442 can be positioned opposite one another in the internal volume of the device, such as at opposite sidewalls of the housing 402 of the device, in order to reduce interference and increase antenna performance and efficiency.

In addition to multiple antenna feed assemblies 440, 442, the device 400 can include a number of grounding components that can serve to electrically ground the antenna assembly and/or antenna feed assemblies 440, 442, for example, to the housing 402. In some examples, grounding components 451, 452 can be located in relatively close proximity to the feed, such as antenna feed 442, which is driving a higher range of frequencies. The device 400 can also include other grounding components 453 and can include electrical grounding through conductive tapes or other materials at desired locations, such as location 454. Further, in some examples, one or more electrical components of the device 400 can act as a grounding component or can include a grounding component thereon or therein. For example, an input component 408, which can be a crown module, can include the grounding component 452.

In addition to driving different frequency bands, the antenna feed assemblies 440, 442 can selectively act as electrical grounds. That is, if one antenna feed assembly 440, 442 is driving the resonating element of the antenna, while the other antenna feed assembly 440, 442 is not actively driving, the antenna feed assembly 440, 442 that is not actively driving can serve as an electrical ground for the antenna feed assembly 440, 442 that is actively driving, thereby further increasing the antenna's efficiency.

Figure 2B:
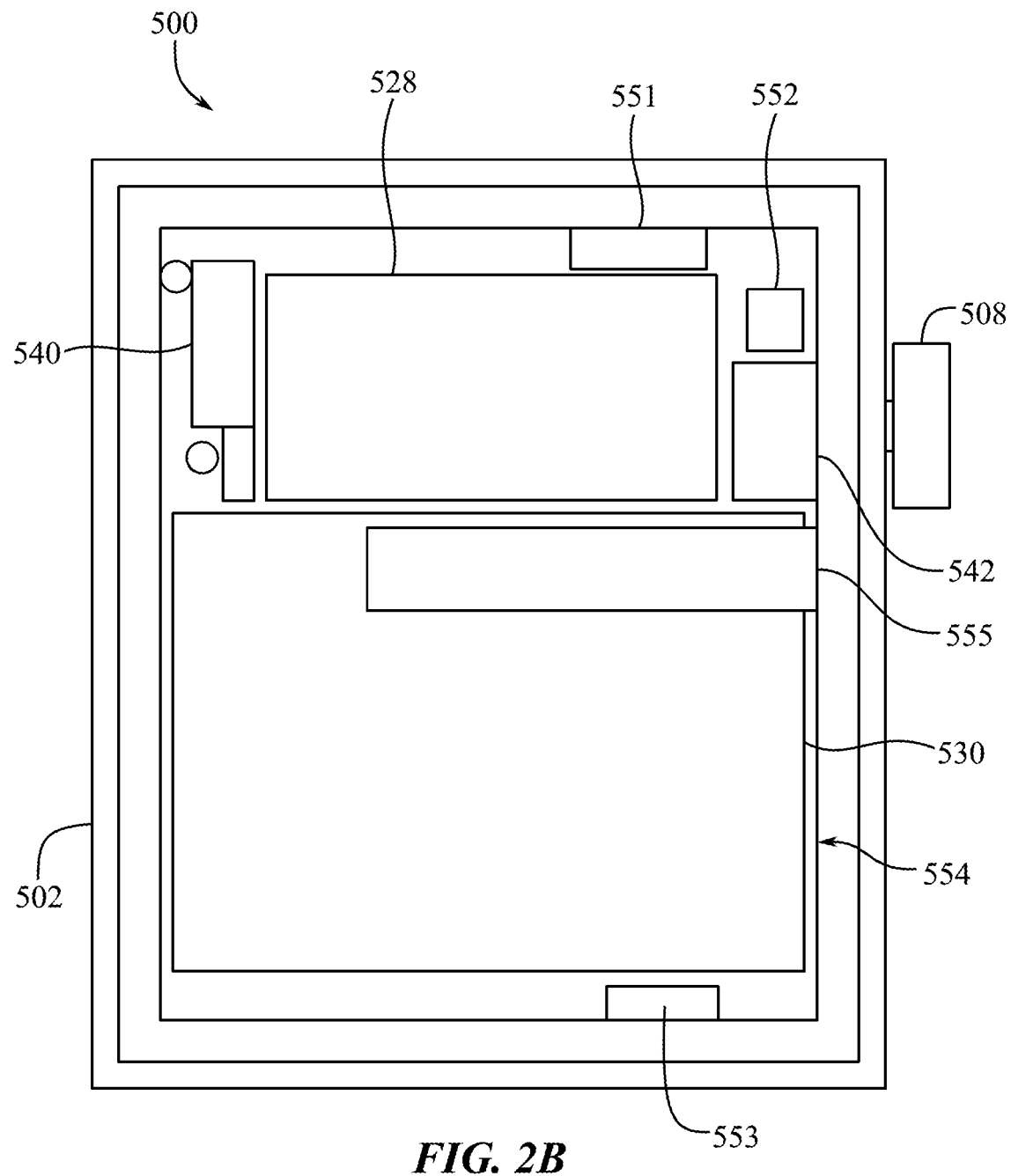
FIG. 2B shows a cross-sectional top view of an electronic device.

FIG. 2B shows a cross-sectional top view of an electronic device 500 that can be substantially similar to the device 400 shown in FIG. 2A. In some examples, a housing 502 can define an internal volume with components contained therein. Several components have been omitted for simplicity, but the housing 502 can contain various electronic components, such as a battery 530, a haptic feedback module 528 positioned near or adjacent to the battery 530. The device 500 can include other electronic components, such as an input component, or crown 508. In some examples, the device 500 can include one or more antennas and the associated components necessary to send and/or receive signals through these antennas.

As with the device 400 of FIG. 2A, the device 500 shown in FIG. 2B can include multiple antenna feed assemblies 540, 542 that can operate at one or more frequency bands as desired. Whereas an electrical component 408 could include or serve as a grounding component in FIG. 2A, in the example shown, an electrical component, such as input component 508 can be attached to or can include one of the antenna feed assemblies 542. The device 500 can further include several grounding components 551, 552, 553, such as those described with respect to FIG. 1A. In addition to grounding locations, such as location 554, the device 500 can include conductive grounding components, such as conductive tape 555 that can be positioned near or adjacent to the feed assembly 442, to ground other electrical components located nearby.

Figure 3A:
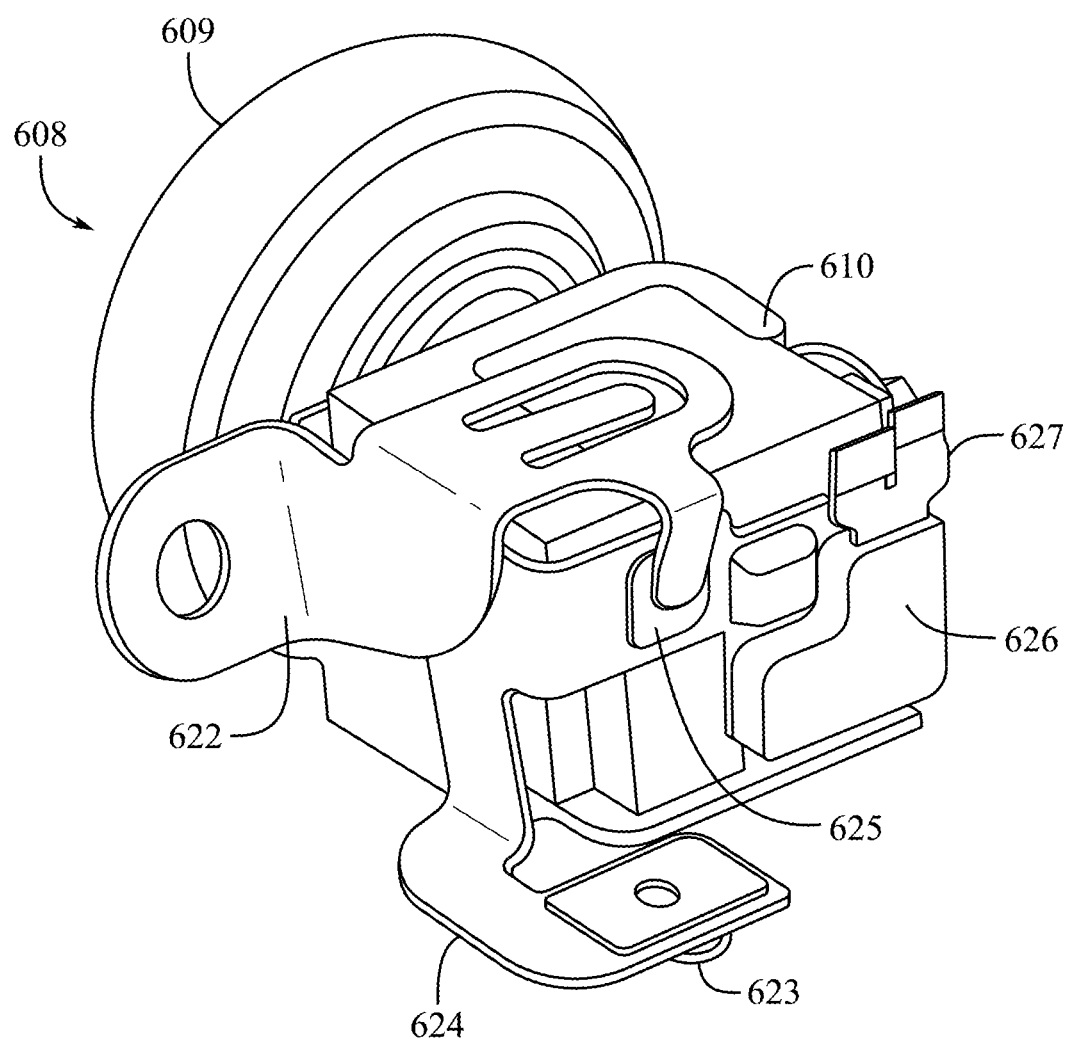
FIG. 3A shows a perspective view of a component of an electronic device.

FIG. 3A shows a perspective view of a component 608 of an electronic device. In this example, the component 608 is an input component that can be substantially similar to the input components described herein, including input component 508. The input component 608 can include an input portion 609 that can be manipulate-able by a user and may be located at an exterior of the device. The input component 608 can also include a component housing 610 that can house the electronics of the component 608 and may be formed from any material as desired, including metal. The component 608 can also include an antenna feed assembly integral therewith or attached thereto.

The antenna feed assembly can include a conductive grounding component 622 that is electrically connected to the component housing 610 and the device housing, the conductive grounding component 622 at least partially surrounding a first major surface and a second major surface of the component housing 610. Although shown as surrounding or covering at least part of two major surfaces of the component housing 610, the grounding component 622 can surround one, two, three, or even all of the major surfaces of the component housing 610. In some examples, the grounding component 622 can include metal, such as copper, aluminum, or steel. The antenna feed assembly can further include an antenna feed component 626 that can be electrically connected to the grounding component 622 and disposed adjacent to the component housing 610. The feed component 626 can be connected to a flexible electrical connector 624 that can be coupled to a processor of the device, such as through connection portion 623, and to the grounding component 622 such as through contact 625.

In some examples, and as described further herein, the feed component 626 can include a feed connector or feed blade 627 that can be configured to couple to a resonating element of the antenna. In some examples, the feed blade 627 can be configured to provide a double sided electrical contact with a corresponding connector in a volumetrically efficient manner, so as to allow for components of the device to be positioned as close to the input component 608 as desired. Additionally, although not shown, other material can be positioned adjacent to the input component 608 to both protect the antenna feed assembly and to electrically isolate it from adjacent components. Referred again to FIG. 2B, a biasing foam can be positioned between the input component 508 including an antenna feed 542 and the adjacent component 528.

Figure 3B:
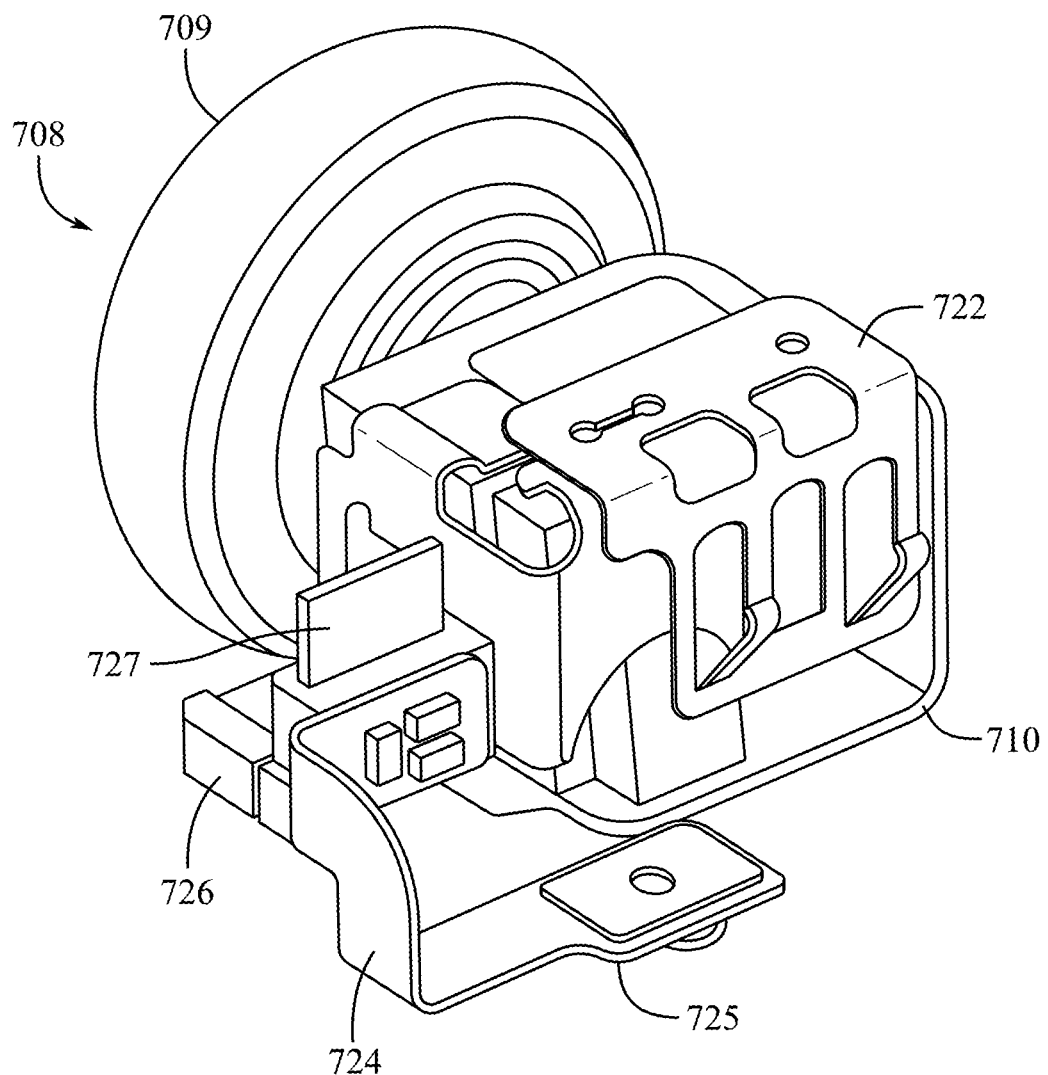
FIG. 3B shows a perspective view of a component of an electronic device.

FIG. 3B shows a perspective view of a component 708 of an electronic device. In this example, the component 708 is an input component that can be substantially similar to the input components described herein, including input components 408, 608. The input component 708 can include an input portion 709 that can be manipulate-able by a user and may be located at an exterior of the device. The input component 708 can also include a component housing 710 that can house the electronics of the component 708 and may be formed from any material as desired, including metal. The input component 708 can also include a grounding component 722 that can provide electrical grounding for an antenna assembly and/or an antenna feed assembly positioned near to the input component 708.

In the present example, the antenna feed assembly can include a feed component 726 that can be connected to a flexible electrical connector 724 that can be coupled to a processor of the device, such as through connection portion 725. The feed component 726 can include a feed connector or feed blade 727 that can be configured to couple to a resonating element of the antenna.

In some examples, the grounding component 722 can be conductive or include a conductive materials. In some examples, the conductive grounding component 722 at least partially surrounding a first major surface and a second major surface of the component housing 710. Although shown as surrounding or covering at least part of two major surfaces of the component housing 710, the grounding component 722 can surround one, two, three, or even all of the major surfaces of the component housing 610. In some examples, the grounding component 722 can include metal, such as copper, aluminum, or steel. In some examples, the grounding component 722 can be adhered, bonded, or joined to the component housing 710 in any manner desired, such as through conductive adhesives and/or welding, including laser welding. As described further with respect to FIG. 3G, the grounding component 722 can also include one or more electrical contacts that can provide an electrical ground connection to one or more adjacent components, such as component 430 shown in FIG. 2A.

Figure 3C:
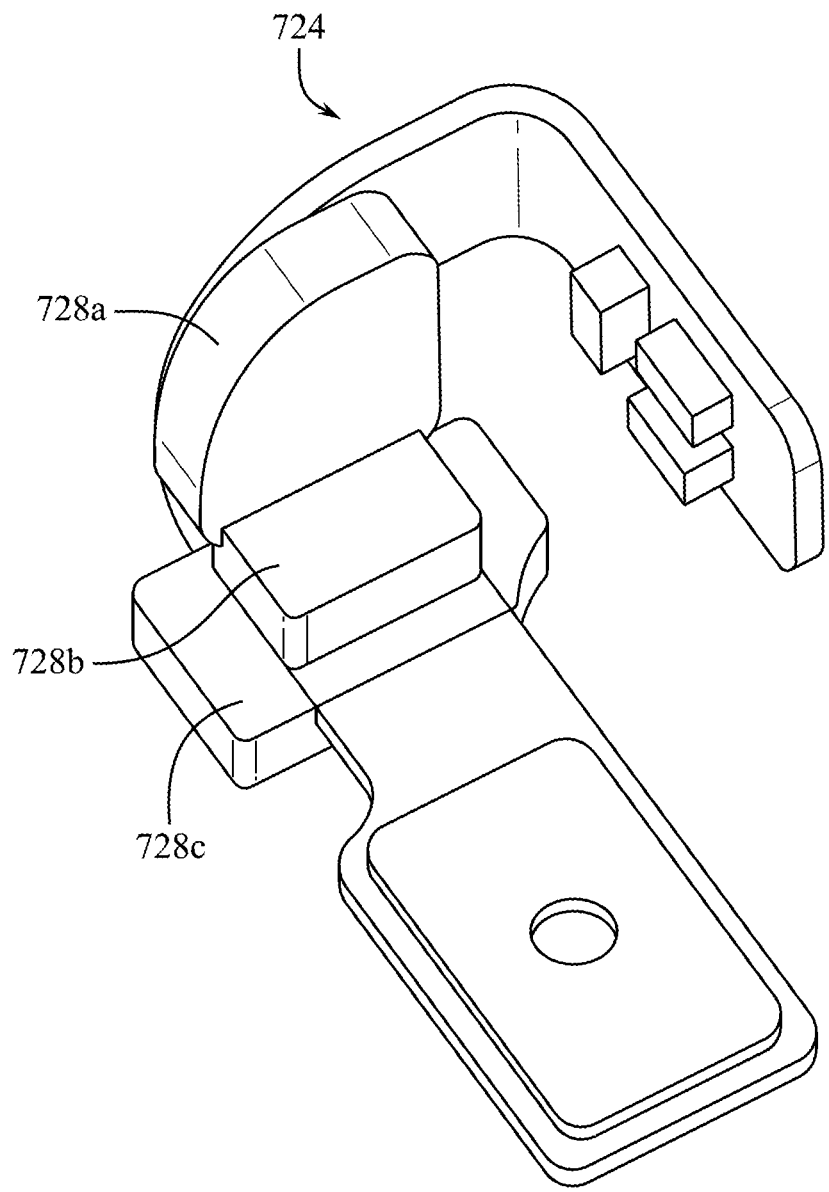
FIG. 3C shows a perspective view of a component of an electronic device.

FIG. 3C shows an isolated view of an example of a flexible electrical connector 724, which can be coupled to a processor of the present device, such as through the connection portion 725 shown in FIG. 3B. In the example shown in FIG. 3C, the flexible electrical connector 724 can include one or more position constrainers, for example first position constrainer 278a, second position constrainer 728b, and third position constrainer 728c. One or more other examples can include one, two, or more than three position constrainers. The position constrainers 728a-c are positioned on the flexible electrical connector 724 in such a way that the position constrainers 728a-c press against surrounding components of the device, including housing components, haptic engine body components, or other components surrounding the flexible electrical connector 724, and constrain the flexible electrical connector 724 in place.

The position of the flexible electrical connector affects RF performance. Assembly variations and tolerances between devices can result in slight variations in positioning of the flexible electrical connector 724 and any surrounding components. The position constrainers 728a-c can include flexible, elastic materials, for example foam materials or other elastic materials such as rubbers and other polymers, which compress between the flexible electrical connector 724 and surrounding components. In this way, the position constrainers 728a-c can sandwich the flexible electrical connector 728 within the device and between adjacent components of the device to maintain proper distances between the flexible electrical connector 728 and any surrounding components. In this way, the flexible electrical connector 724 is consistently positioned within the device regardless of variations that can be introduced because of manufacturing and assembly tolerances.

In the illustrated example of FIG. 3C, the first position constrainer 728a is positioned vertically along a surface of the flexible electrical connector 724, the second position constrainer 728b is positioned horizontally on a surface of the flexible electrical connector 724, and the third position constrainer 728c is positioned horizontally on a surface of the flexible electrical connector 724 opposite the surface on which the second position constrainer 728b is positioned. Again, the number, size, shape, materials, and specific placement of each position constrainer 728a-c can vary in one or more other examples to provide consistent positioning of flexible electrical connectors 724 based on various other components that may surround the flexible electrical connector 724.

Figure 3D:
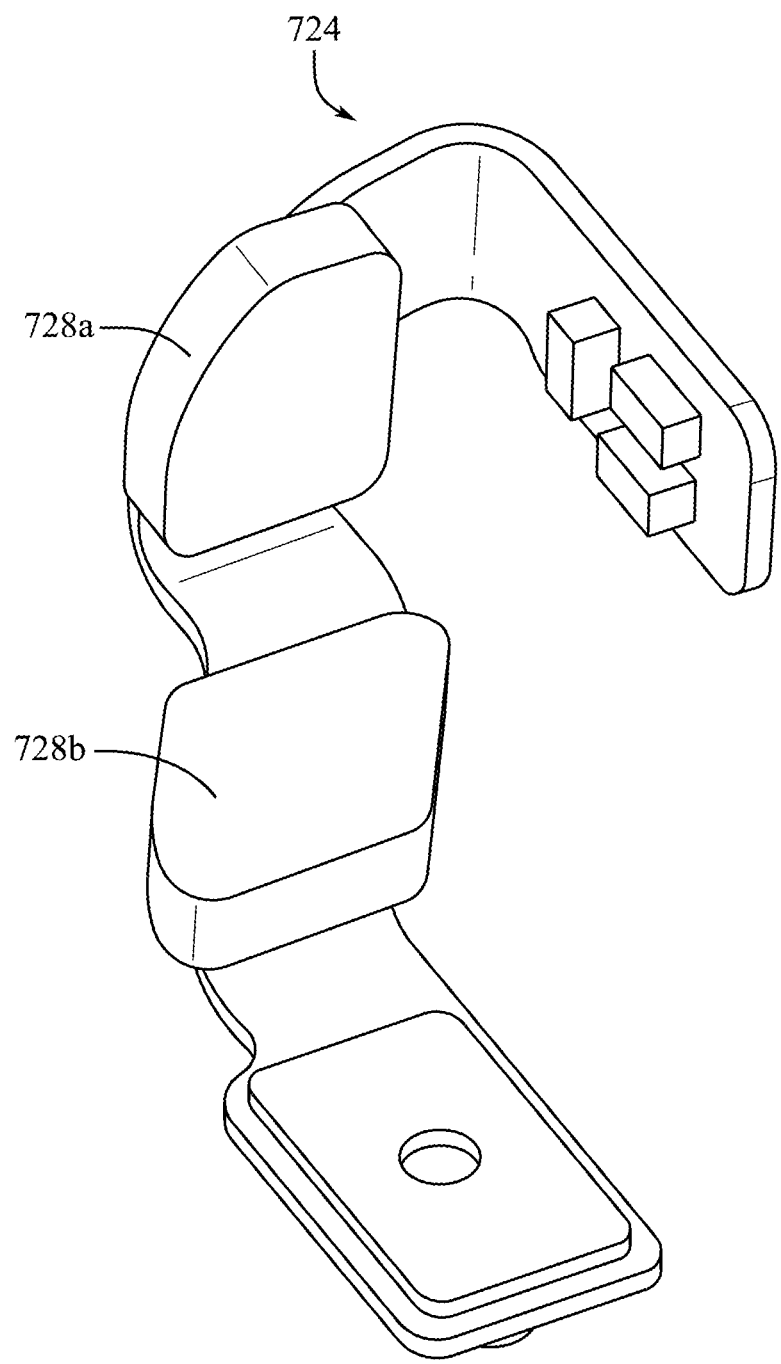
FIG. 3D shows a perspective view of a component of an electronic device.
Figure 3E:
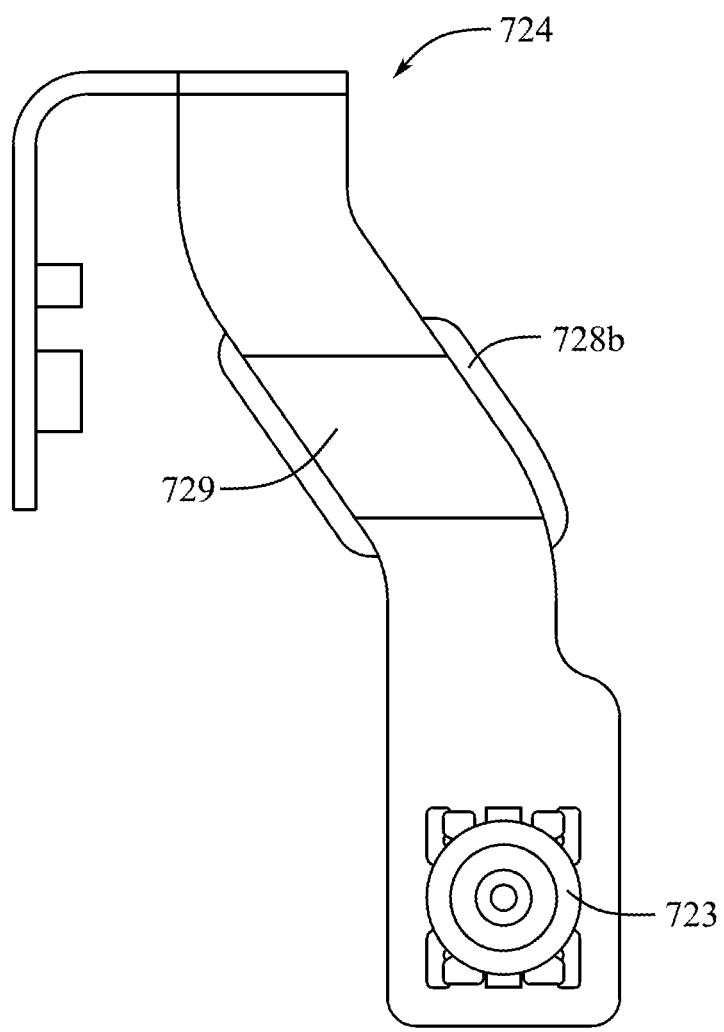
FIG. 3E shows a bottom view of a component of an electronic device.

Similarly, FIG. 3D shows another example of a flexible connector 724 having a slightly different geometry and configuration than that shown in FIG. 3C. In the example of FIG. 3D, a first position constrainer 728a is disposed vertically along a surface of the flexible electrical connector 724 and a second position constrainer 728b is disposed horizontally on a surface of the flexible electrical connector 724. FIG. 3E shows a bottom view of the flexible electrical connector 724 shown in FIG. 3D. This bottom view shows a lower ground contact 729 along a lower surface of the flexible electrical connector 724. The ground contact 729 can include and exposed portion of the flexible electrical connector 724. In one example, the ground contact 729 can include a conductive pressure-sensitive-adhesive (PSA) that binds the ground contact 729 portion of the flexible electrical connector 724 to a ground contact, such as a separate conductive bracket that is tied to ground.

In examples of flexible electrical connectors 724 that include an additional ground, such as ground contact 729 shown in the example of FIG. 3E, the effective trace length of the flexible electrical connector 728 can be reduced. In this way, longer or larger flexible electrical connectors, such as that shown in FIGS. 3D and 3E, can be utilized without extending the trace length, thus reducing losses and improving reliability via the added ground contact 729. In addition, the position constrainer 728b can be sandwiched between the flexible electrical connector 724 and an adjacent component to press downward on the flexible electrical connector 724 to maintain the lower ground contact 729 and connection portion 723 in good contact with respective contact components (not shown).

Figure 3F:
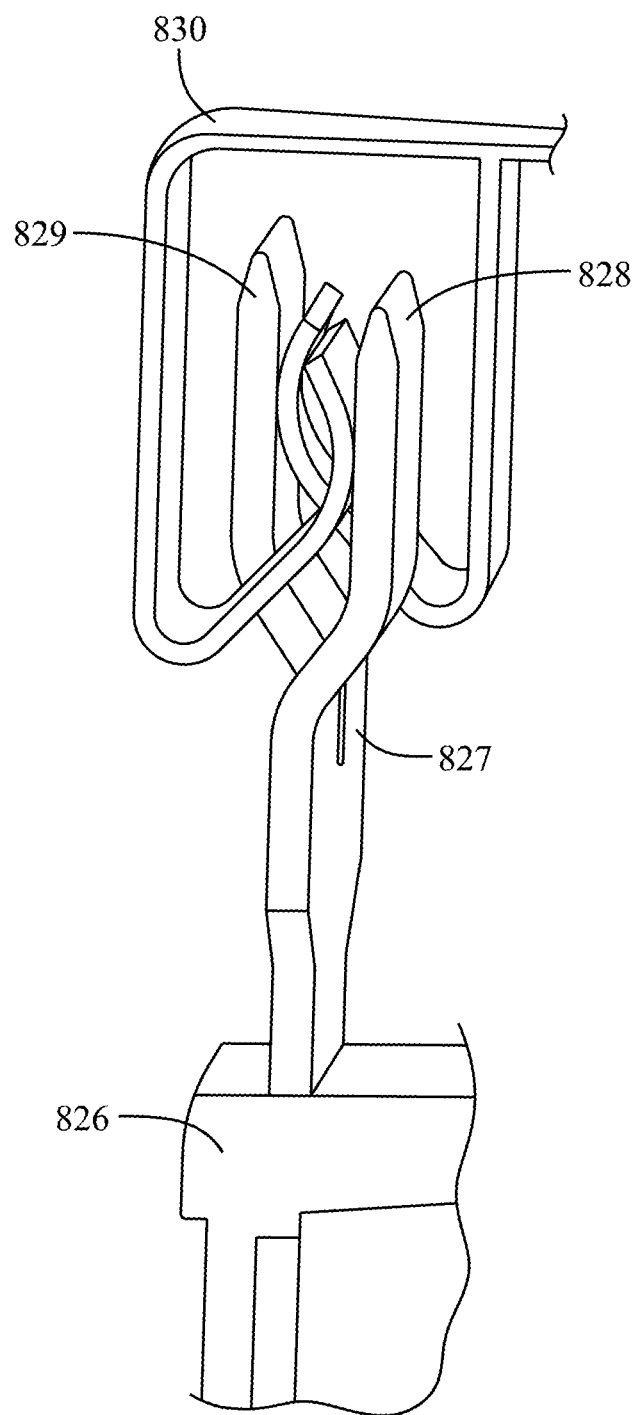
FIG. 3F shows a perspective view of a connector of an electronic device.
Figure 3G:
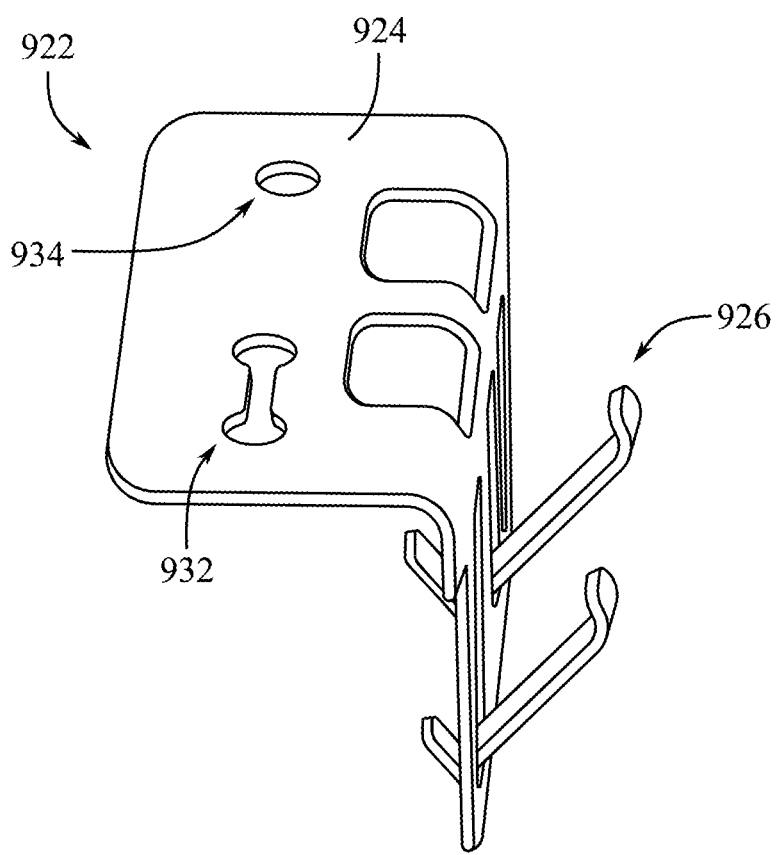
FIG. 3G shows a perspective view of a component of an electronic device.

FIG. 3F shows a perspective view of a feed connector or feed blade 827 connected to the feed component 826 of a feed assembly of an electronic device, such as the feed assembly shown in FIG. 3A. In the present example, the volumetrically efficient, double-sided electrical connection achieved by the feed blade 827 and an associated electrical connector 830 is shown. The feed blade 827 can include a first tine or finger 828 and a second tine or finger 829 that can be laterally offset from the first tine 828 while extending vertically in a same direction. The associated electrical connector 830, which can be connected to other components or an antenna of the device, can include corresponding fingers or protrusions that are also laterally offset from one another. In use, the tines 828, 829 of the feed blade 827 push in opposite directions against the fingers of the connector 830 in order to provide a mechanically and electrically robust connection that also allows for relatively easy assembly or insertion. Although the present example shows only two tines 828, 829, in some examples, the feed blade 827 can include any number of laterally offset tines as desired, including 3 or 4 tines FIG. 3G shows a perspective view of a grounding component 922 that can be associated with an electrical component of a device. In some examples, the grounding component 922 can be substantially similar to and include some or all of the features of the grounding component 722 shown in FIG. 3B. Thus, in use, the grounding component 922 can be laser welded into an associated electrical component. For example, a top portion 924 of the grounding component 922, which may cover at least a portion of a major surface of an associated electrical component, can define one or more apertures 932, 934 through which mechanical and/or electrical contact to the associated electrical component can be achieved. The grounding component 922 can also include one, two, three, or more contacts 926 that can extend from a portion of the grounding component 922 at any location or locations as desired. These contacts 926 can include fingers or tines that can extend away from the component housing to which the grounding component 922 is attached, for example, at any angle as desired. The contacts 926 can make electrical and/or physical contact with adjacent electrical components, such as component 528 shown in FIG. 2B to provide a reliable electrical ground path without the need for relatively large connectors or components.

Figure 3H:
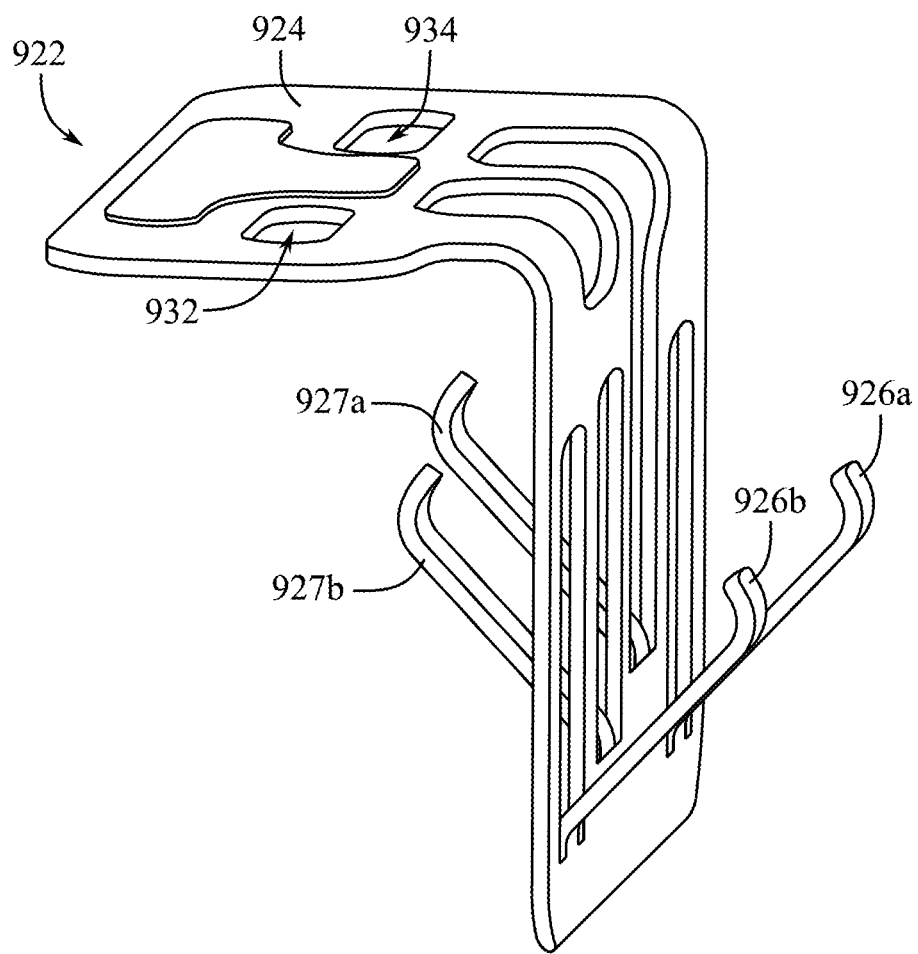
FIG. 3H shows a perspective view of a component of an electronic device.
Figure 31:
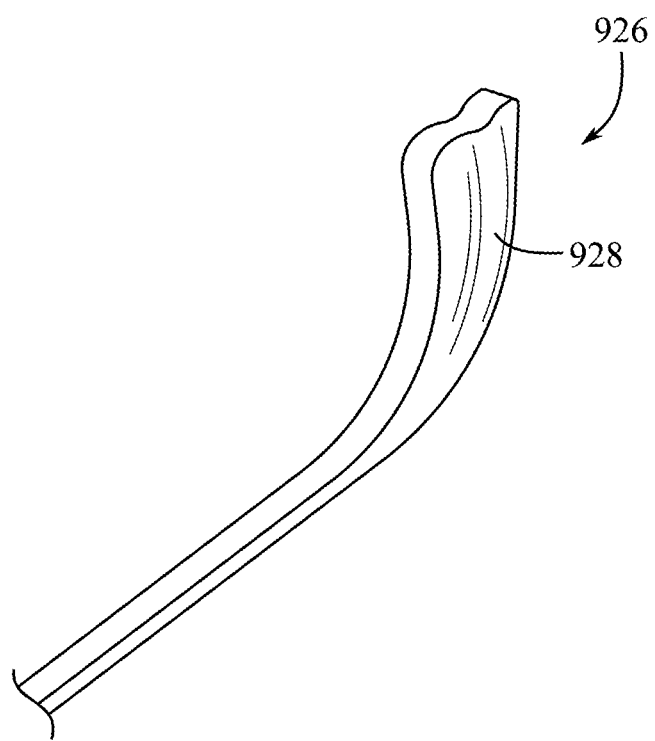

FIG. 3H shows a perspective view of another example of a grounding component 922 that can be associated with an electrical component of a device. In some examples, the grounding component 922 of FIG. 3H can be substantially similar to and include some or all of the features of the grounding component 722 shown in FIG. 3B. Thus, in use, the grounding component 922 of FIG. 3H can be laser welded into an associated electrical component. For example, a top portion 924 of the grounding component 922, which may cover at least a portion of a major surface of an associated electrical component, can define one or more apertures 932, 934 through which mechanical and/or electrical contact to the associated electrical component can be achieved.

The grounding component 922 can also include one, two, three, four or more contacts, including a first set of contacts 926a, 926b and a second set of contacts 927a, 927b that can extend from a portion of the grounding component 922 at any location or locations as desired. These contacts 926a-b, 927a-b can include fingers or tines that can extend away from the component housing to which the grounding component 922 is attached, for example, at any angle as desired. The contacts 926a-b, 927a-b can make electrical and/or physical contact with adjacent electrical components, such as component 528 shown in FIG. 2B, to provide a reliable electrical ground path without the need for relatively large connectors or components.

In the illustrated example of FIG. 3H, the grounding component 922 includes four contacts 926a-b, 927a-b, with a first set of contacts 926a-b extending opposite a second set of contacts 927a-b. The four contact configuration of FIG. 3H can increase electrical contacts to improve ground quality and reduce de-sense between certain bands. FIG. 3I illustrates a close-up perspective view of the tip of an example of a contact 926. In at least one example, as shown, the contact can include a curvilinear ridge 928 extending outward from the contact 926 at an end thereof. The ridge 928 can ensure proper contact is made between the contact 926 and adjacent components even in cases where the grounding component 922, or one or more other components of the device, is manufactured or assembled slightly off axis or at an angle, or when drop events cause various internal components of the device, including components with which the contact 926 physically engages, shift or bend slightly due to damage. The rounded, curvilinear ridge 928 can compensate for any such variations and maintain sufficient contact for the grounding path.

Figure 3J:
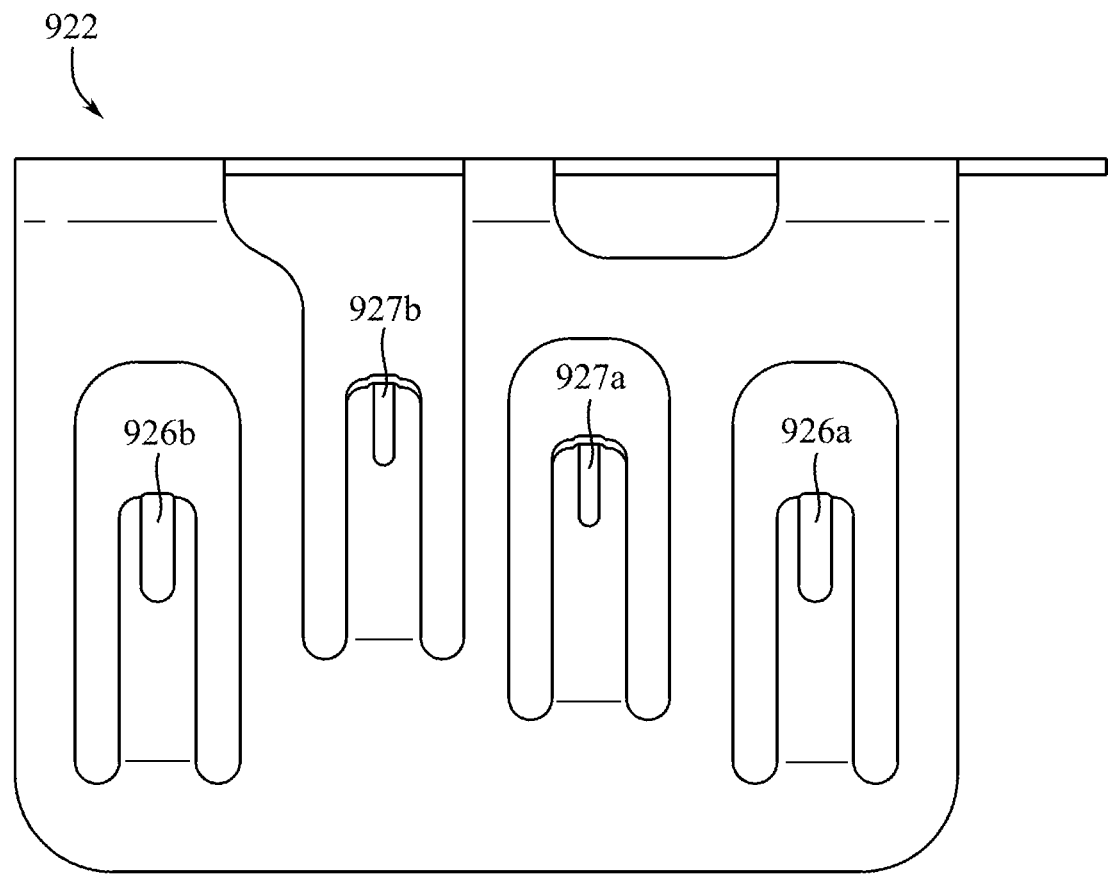
FIG. 3J shows a side view of a component of an electronic device.

In one example, as shown in FIG. 3J, a vertical position of the contacts 926a-b, 927a-b of the grounding component 922 can be staggered to accommodate components with which the contacts 926a-b. 927a-b physically engage to form the grounding path. For example, the housing 710 shown in FIG. 3B or other intermediate components disposed between the housing 710 and the grounding component 722, 922 against which at least some of the contacts 927a-b press, can include recessed portions or other irregular geometries. The staggered height of the contacts 926a-b, 927a-b, including the raised vertical positions of the second set of contacts 927a-b, can accommodate such irregularities to ensure proper ground contacting positions.

In at least one example, referring back to FIG. 3H, the grounding component 922 can include slotted apertures 932, 934 defined by the top portion 924 through which mechanical and/or electrical contact to the associated electrical component can be achieved. In the example shown in FIG. 3H, the elongated slot geometry can provide additional room within which to work and form electrical connections with components underneath the top portion 924, for example forming solder beads. The elongated slots can also provide added visibility to inspect such connections and solder beads from lower angles relative to the plane in which the top portion 924 lies without the thickness of the top portion obstructing the view. In addition, such elongated slot portions can improve assembly tolerances when aligning the slots 932, 934 over electrical connection portions of components on which the top portion 924 of the grounding component 922 is disposed.

Figure 4A:
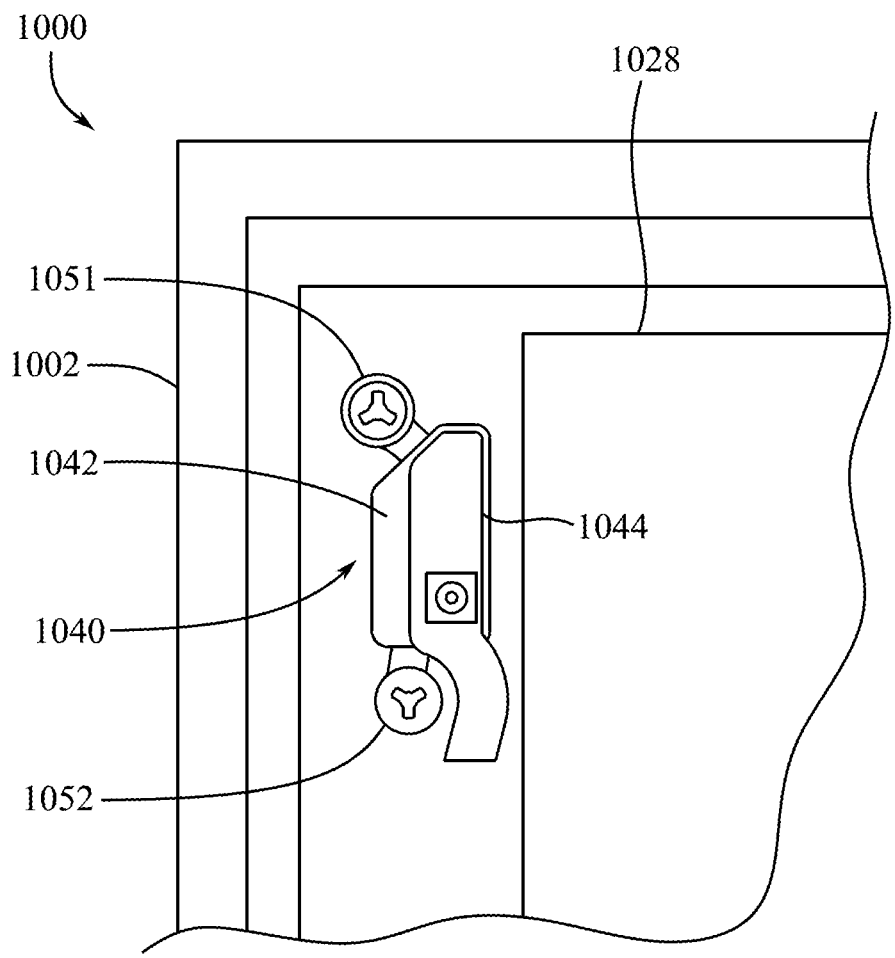
FIG. 4A shows a cross-sectional top view of a portion of an electronic device.

FIG. 4A shows a cross-sectional top view of a portion of an electronic device 100 that can be substantially similar to the devices 400, 500 discussed in FIGS. 2A and 2B. FIG. 4A shows a view corresponding to the upper left corner of the devices 400, 500 of FIGS. 2A and 2B. As shown, the device 1000 can include a housing 1002 and one or more components 1028 disposed in an internal volume defined by the housing 1002. The device 1000 can also include one or more antenna feed assemblies, such as antenna feed assembly 1040, which can correspond to antenna feed assemblies 440, 540 shown in FIGS. 2A and 2B. The antenna feed assembly 1040 can include an insert molded feed component 1042 that can include multiple grounding components 1051, 1052 extending therefrom. The grounding components 1051, 1052 can electrically ground the feed component 1042 to the housing 1002 or other components of the device 1000. The feed assembly 1040 can also include a flexible electrical connector 1044 that can connect the feed component 1042 to one or more processors or other components of the device 1000.

Figure 4B:
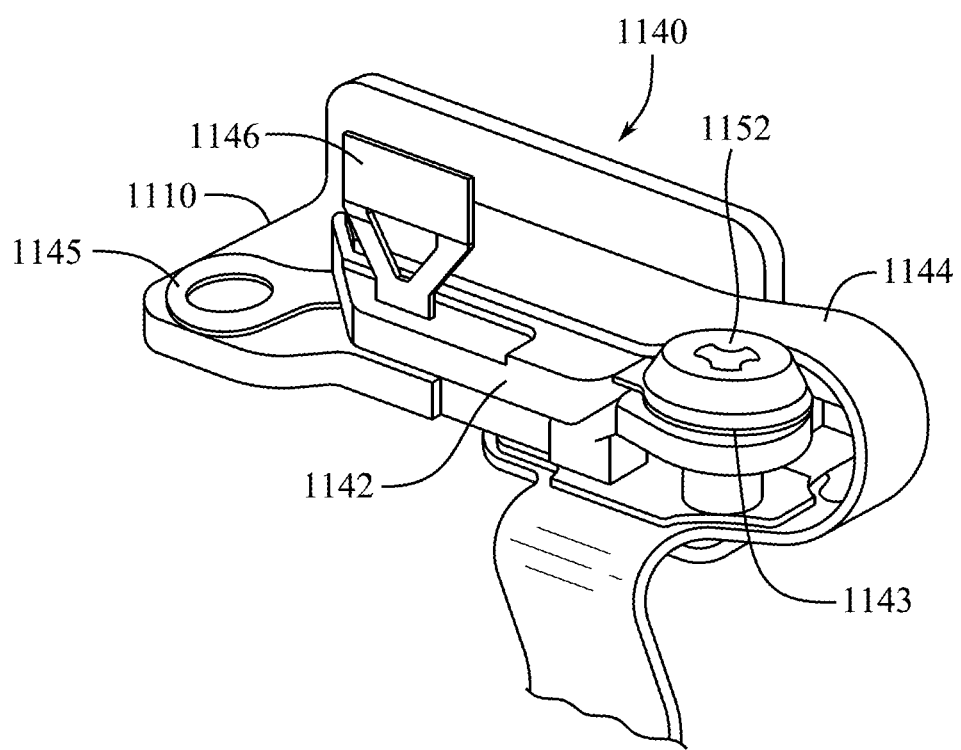
FIG. 4B shows a perspective view of a component of an electronic device.

FIG. 4B shows a perspective view of an antenna feed assembly 1140 of an electronic device that can be substantially similar to, or the same as, any of the antenna feed assemblies described herein, including feed assembly 1040.

The antenna feed assembly 1140 can include an insert molded feed component 1142 that can include multiple grounding components 1143, 1145 extending therefrom. Each of the grounding components 1143, 1145 can include a conductive material, such as metal, and can define an aperture. A screw, bolt, or other fastening component, such as component 1152, can be passed through the aperture defined by each grounding component 1143, 1145 to mechanically and electrically secure the grounding components 1143, 1145 and thus feed component 1142 to, for example, a portion 1110 of the device housing. Additionally, the grounding components 1143, 1145 can be structured and/or positioned so that they are biased against a surface of the portion 1110. For example, in an unattached state, the grounding components 1143, 1145 can extend downward, away from the feed component 1142. When the feed component 1142 is positioned in the device, the interference fit between the grounding components 1143, 1145 and the portion 1110 can exert a biasing force against the grounding components 1143, 1145, while the screw or fastener, such as 1152, can press against the grounding components 1143, 1145 and portion in a direction opposite the biasing force. In this way, even if the fastener 1152 were to back-out or be removed from the grounding components 1143, 1145, the biasing force would still provide for a reliable electrical contact.

In some examples, a feed connector or feed blade 1146 can extend from the feed component 1142 and can be configured to couple to a resonating element of the antenna. The feed component 1142 can also include one or more electrical components associated with driving an antenna and can, for example, act as a tuner for the antenna feed to allow the feed to switch between different frequency bands and/or to act as an electrical ground as desired. As can be seen, a flexible electrical connector 1144 can electrically connect to the feed component 2142 and to one or more other components, such as one or more processors and/or drivers.

As described with respect to FIGS. 2A and 2B, by providing two or more antenna feeds in an electronic device, of which antenna feed assembly 1140 may be one, may eliminate the need for switch componentry that is required to achieve similar operating frequencies through a single antenna feed. Accordingly, the antenna feed assembly 1140 may not include or need a switch component, and thus may have a relatively compact and/or space-saving design. Further, the use of multiple antenna feed assemblies can allow for each antenna feed assembly, such as assembly 1140, to be located physically closer to the components that power or drive the feed, thereby increasing the efficiency of the associated antenna or antennas. In some examples where tri-plexing is implemented rather than quad-plexing, as described herein, the complexity of the system and device can reduced because various components that take up space within the device can be beneficially positioned or clustered next to respective feed points of those components for efficiency.

Figure 4C:
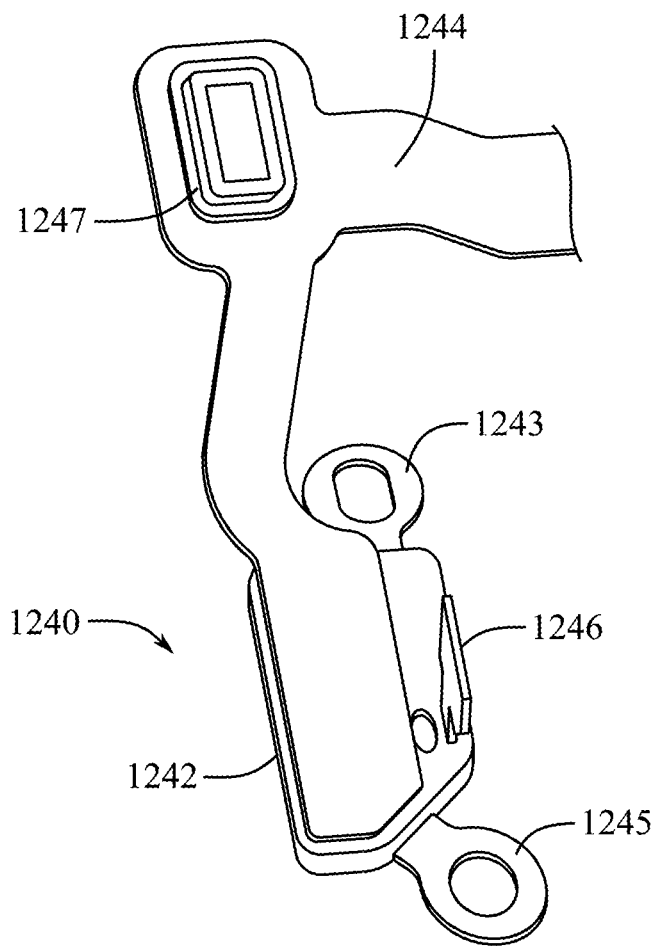
FIG. 4C shows a perspective view of a component of an electronic device.

FIG. 4C shows a perspective view of an antenna feed assembly 1240 of an electronic device that can be substantially similar to, or the same as, any of the antenna feed assemblies described herein, including feed assemblies 1040, 1140. As with the feed assembly 1140, the feed assembly 1240 can include a feed component 1242 that can include multiple grounding components 1243, 1245 and a feed blade 1246 extending therefrom. A flexible electrical connector 1244 can be electrically connected to the feed component 1242 as shown. Whereas the feed assembly 1140 of FIG. 4B is shown in a substantially assembled or final configuration, the feed assembly 1240 is shown with the flexible electrical connector 1244 in an unfolded configuration in order to demonstrate its geometry. In at least one example, the flexible electrical connector 1244 does not include interconnects, which reduces potential areas for losses.

In use, the flexible electrical connector 1244 can be folded down an around the feed component 1242, where an electrical connector 1247, such as a board to board connector, can couple with one or more other components of the device, including one or more processors or SiPs as described herein. Further, as shown, the flexible electrical connector 1244 can include a portion that extends pass the connector 1247 and which can be electrically connected to additional components of the device, such as other processors or SiPs as desired. By using a single flexible electrical connector 1244 that can electrically connect to multiple components, the number of components necessary to drive the antennas of a device can be reduced, and the volume of the antenna components can be reduced, thereby allowing for smaller devices, or devices that include more or improved features.

Figure 4D:
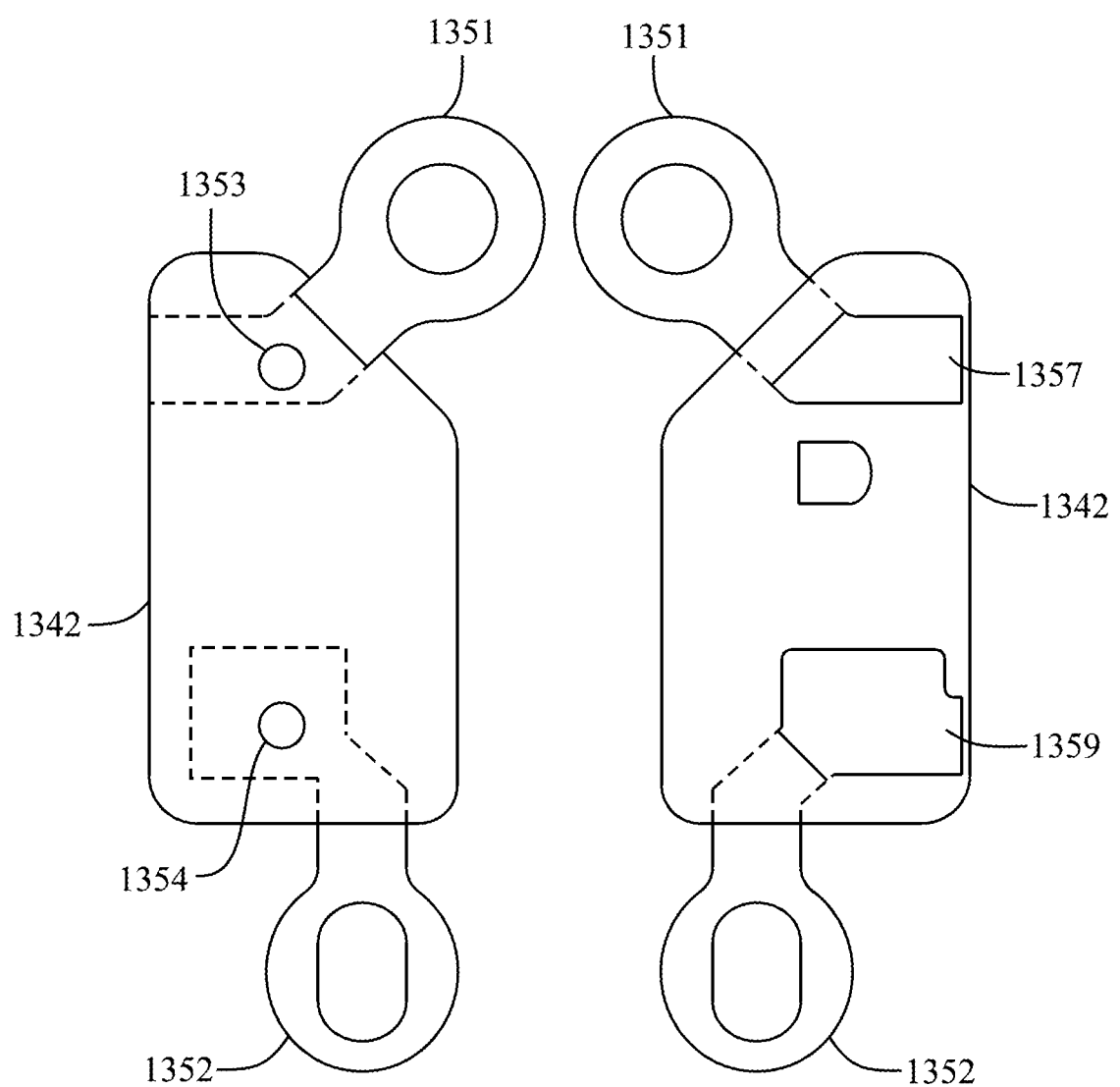
FIG. 4D shows top and bottom views of a component of an electronic device.

FIG. 4D shows top and bottom views of a feed component 1342 of an antenna assembly for an electronic device. The feed component 1342 can be substantially similar to, or the same as, the feed components 1042, 1142, 1242 discussed herein. The feed component 1342 can be or include a molded material, such as an insert molded material, that can at least partially surround a first grounding component 1351 and a second grounding component 1352. That is, the conductive grounding components 1351, 1352 can be embedded in a molded polymer body of the feed component 1342. Additionally, in some examples, the molded portion of the feed component 1342 can define one or more apertures or openings 1353, 1354 on a first surface that can provided electrical contacts for the grounding components 1351, 1352. The molded portion of the feed component 1342 can also define one or more apertures 1357, 1359 on a second, different surface thereof to provide additional electrical contacts.

Figure 5B:
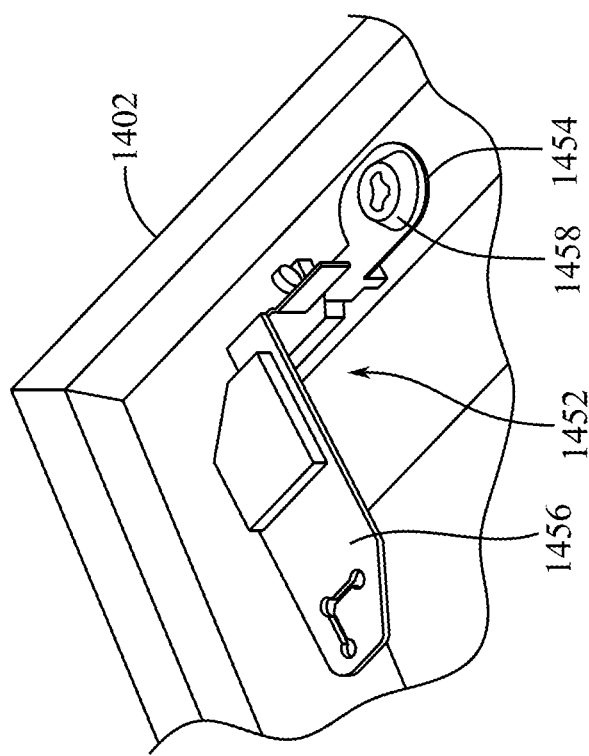
FIG. 5B shows a perspective view of a component of an electronic device.
Figure 5A:
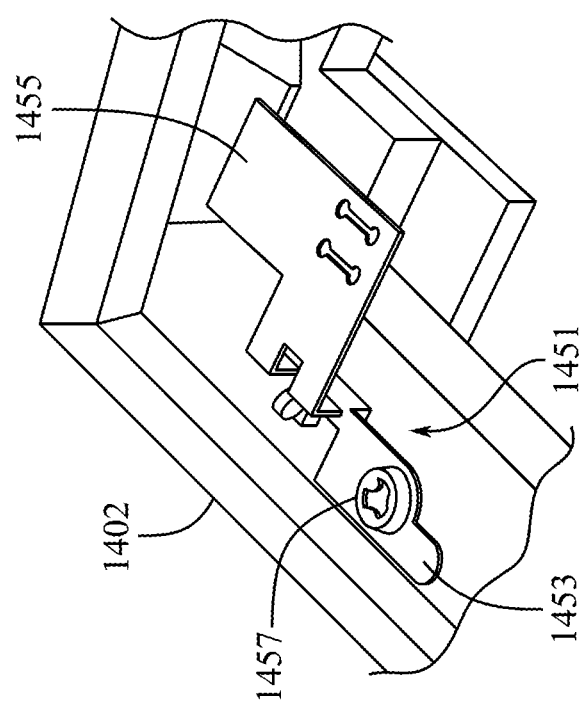
FIG. 5A shows a perspective view of a component of an electronic device.

FIG. 5A shows a perspective view of a grounding component 1451 of an antenna assembly for an electronic device. The grounding component 1451 can include some or all of the features of, and be substantially similar to, any of the grounding components described herein, including grounding components 451, 551 described with respect to FIGS. 2A and 2B. In the present example, the grounding component 1451 is attached to the sidewall of an electronic device housing 1402 at a desired location. The grounding component 1451 can include an attachment portion 1453 that can define an aperture or attachment feature. A fastener, such as a screw 1457, can pass through the attachment feature to secure the grounding component 1451 to the housing 1402. In some examples, the fastener can mate with a corresponding feature in the housing 1402. A contact portion 1455 can extend from the attachment portion 1453 and can be electrically connected to one or more components of the device to provide them with a path to electrical ground, such as an electrical path to the housing. In some examples, the contact portion 1455 can be soldered or otherwise electrically connected to a resonating element and/or antenna of the device.

In some examples, the position of the grounding component 1451 on the housing 1402 can be moveable and/or adjustable. That is, the attachment portion 1453 can be attached or coupled to the housing 1402 in such a way as to allow the grounding component 1451 to be secured at a variety of locations as desired. Thus, in some examples, the grounding component 1451 can be an adjustable grounding component that is moveably attached to the sidewall of the housing 1402. In some examples, the physical distance between an antenna feed of the electronic device and the grounding components it is electrically connected to, such as grounding component 1451, can at least partially determine a resonant frequency of the antenna. Accordingly, the distance between the antenna feed and the grounding component 1451 can be adjusted in order to tune the associated antenna and improve performance and/or efficiency at one or more desired frequencies or frequency bands. In some examples, a position of a moveable grounding component 1451 can be adjusted all along the length of the device, for example along an edge of the housing 1402. In one example, the position of the movable grounding component 1451 can be adjusted by 0.1 mm to about 5 mm as desired in order to tune an associated antenna after the device and/or antenna has been at least partially assembled. In another example, the position of the movable grounding component 1451 can be adjusted by 1-2 mm as desired. In one example, the position of the movable grounding component 1451 can be adjusted in increments as small as about 0.5 mm. In one example, adjustments smaller than 0.5 mm can be accomplished through other components that are electrically connected to the movable grounding component 1451.

In at least one example, the attachment portion 1453 can include a curved or bent geometry, especially where screw 1457 presses downward thereon. The curved geometry of the attachment portion 1453 can be present until assembly when a head of the screw 1457 presses downward onto the attachment portion 1453 and the bent geometry thereof. The bent geometry can form an elastically deformed area of the attachment portion 1453 that presses back up against the head of the screw 1457 to improve contact and maintain a locking force on the screw that prevents the screw 1457 from untwisting and retreating away as a result of repeated drops of the device over time.

FIG. 5B shows a perspective view of a grounding component 1452 of an antenna assembly for an electronic device. The grounding component 1452 can include some or all of the features or, and be substantially similar to any of the grounding components described herein, including grounding components 451, 551 described with respect to FIGS. 2A and 2B. In the present example, the grounding component 1452 is attached to the sidewall of an electronic device housing 1402 at a desired location, and can be located on an opposite side of an antenna feed from the grounding component 1451. That is, an antenna feed assembly can be located between the grounding components 1451, 1452. The grounding component 1452 can include an attachment portion 1454 that can define an aperture or attachment feature. A fastener, such as a screw 1458, can pass through the attachment feature to secure the grounding component 1452 to the housing 1402. In some examples, the fastener can mate with a corresponding feature in the housing 1402. A contact portion 1456 can extend from the attachment portion 1454 and can be electrically connected to one or more components of the device to provide them with a path to electrical ground, such as an electrical path to the housing. In some examples, the contact portion 1456 can be soldered or otherwise electrically connected to a resonating element and/or antenna of the device.

Figure 5C:
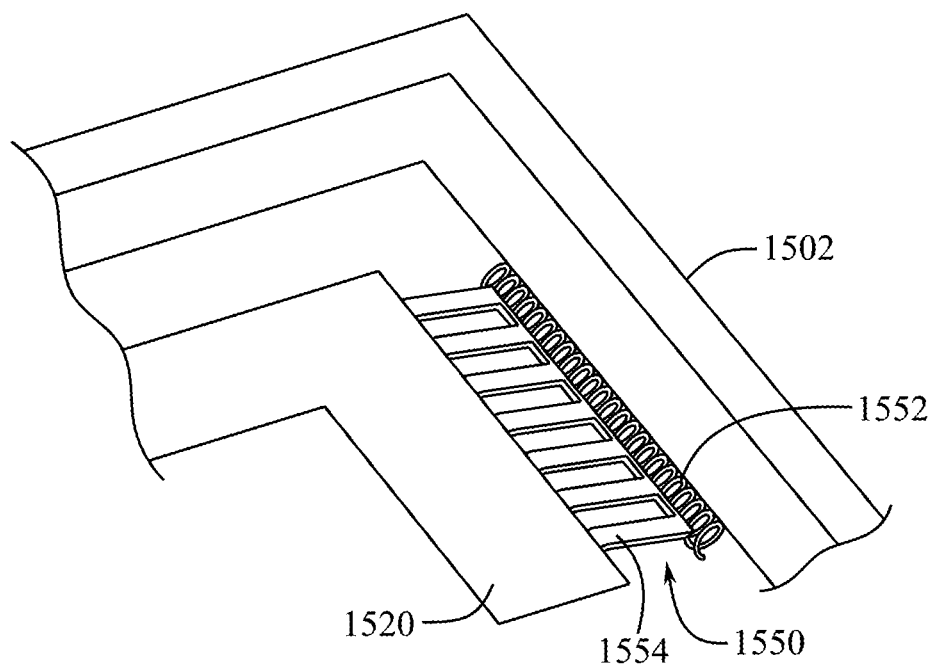
FIG. 5C shows a perspective view of a component of an electronic device.

FIG. 5C shows a perspective view of an alternative configuration of a grounding component 1550 of an antenna assembly for an electronic device. The grounding component 1550 can be used in any of the devices and/or antenna assemblies described herein at any location. In some examples, the grounding component 1550 can provide an electrical connection between an electrical component 1520 and an electrical ground path, such as the housing 1502 of an electronic device. As can be seen, the grounding component 1550 includes one or more tines or fingers 1554 that can be connected to, or extend from a coil structure 1552. In some examples, the tines and/or coil can include a conductive material, for example, a metal, including copper or aluminum. The grounding component 1550 can have substantially and length as desired.

Figure 5D:
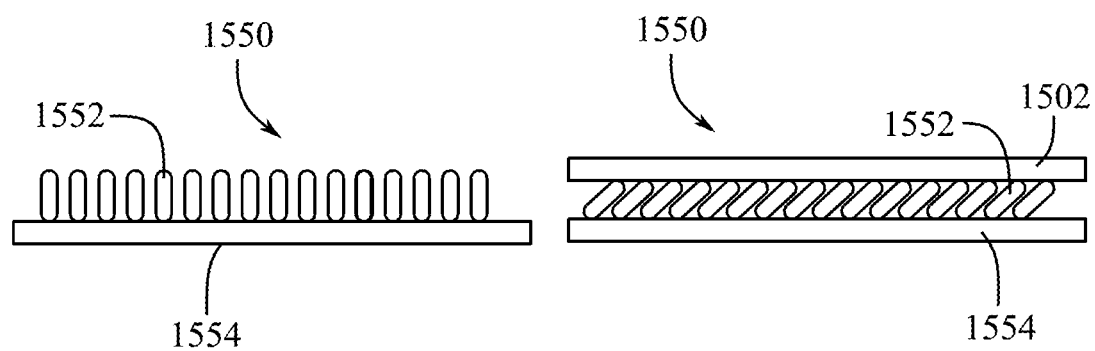
FIG. 5D shows side views of a portion of the component of FIG. 5C.

FIG. 5D shows a simplified side view of the grounding component 1550 in both an uncompressed state, where it is not contacting the housing 1502, and a compressed state, where the grounding component 1550 is in a compressed state and provides an electrical connection between the component 1520 and the housing 1502. As can be seen, the interference fit between the coil 1552 and the gap between the tines 1554 and housing 1502 can serve to compress the coil and provide a biasing force between the grounding component 1550 and the housing 1502. This can ensure a robust electrical contact that can withstand high loads and can even provide a reliable electrical contact in the event that the housing 1502 becomes locally deformed, thereby increasing reliability of the grounding and the associated antenna.

Any number or variety of components in any of the configurations described herein can be included in an electronic device, as described herein. The components can include any combination of the features described herein, and can be arranged in any of the various configurations described herein. The structure and arrangement of components of a device, as well as the concepts regarding their use can apply not only to the specific examples discussed herein, but to any number of embodiments in any combination. Various examples of electronic devices and electronic device components including some having various features in various arrangements are described below, with reference to FIGS. 6-8C.

Figure 6:
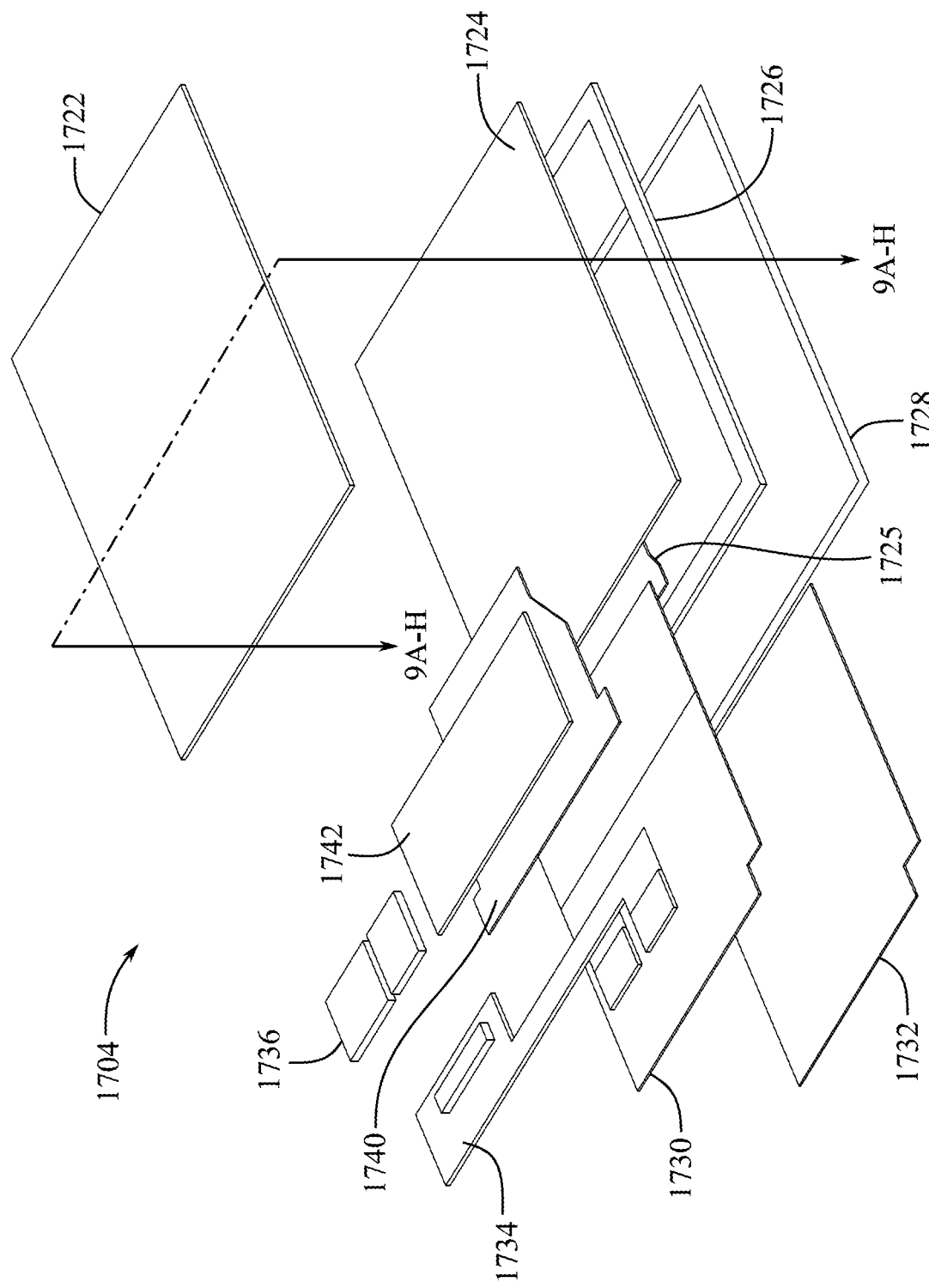
FIG. 6 shows an exploded view of a portion of an electronic device.

FIG. 6 shows an exploded view of a portion of an electronic device. As shown in FIG. 6, a display assembly 1704 for a portable electronic device can include a display panel or display layer 1724 with an array of pixels forming or defining an active area on which content or images may be displayed. Display 1724 may have an associated protective cover layer such as transparent display cover layer 1722. Display cover layer 1722 may be formed from one or more layers of glass, clear polymer, crystalline material such as sapphire or other crystalline material, and/or other transparent structures(s). Display panel 1724 may include a protruding tail portion 1725 (e.g., a flexible tail that protrudes from an edge of the active area.) When display 1724 is mounted in a housing, the tail 1725 may be bent back on itself as shown and described herein and may define a bend or bend region. This may help minimize the size of any inactive display border that is visible by a user such as viewer who is viewing display 1724.

The display assembly 1704 can include various electronic components 1736. In some examples, these components 1736 can include display driver integrated circuits and/or other control circuitry for display 1724. These components 1736 may be mounted directly on tail 1725 and/or on one or more additional printed circuits such as printed circuit board 1730. Electrical connections may be made between printed circuit board 1730, and tail 1725 using solder, conductive adhesive, welds, connectors, and/or other conductive connections. As an example, printed circuit board 1730 may be electrically and mechanically attached to tail 1725 using a conductive adhesive such as anisotropic conductive film 1740, which forms electrical connections between contacts on printed circuit board 1730 and mating contacts on tail 1725. Optional shield 1742 may cover components 1736 on printed circuit board 1730 (e.g., display driver integrated circuits). Additional electronic components of a device including the display assembly 1704 can be connected to the printed circuit board 1730, for example, through one or more electrical connectors, such as connectors 1734 and 1732. In some examples, one or more of the components of the display assembly 1704, such as display layer 1724, can include a resonating element for an antenna, as described herein. In some examples, this resonating element can be electrically connected to and driven by other components of the electronic device, such through connections to the printed circuit board 1730 and/or to any or all of the antenna feed assemblies described herein.

A display mounting component 1726 may be formed from a molded material, such as a molded insulating material, including a polymer (e.g., a low-injection-pressure-overmolded polymer). The material that forms component 1726 may be epoxy, polyurethane, and/or other polymer materials. Thermoplastic and/or thermoset polymer may be used in forming component 1726. Heat and/or light (e.g., ultraviolet light) may be used in curing the polymer forming component 1726. As one illustrative example, component 1726 may be formed from a thermoset structural adhesive such as a one-part heat-cured epoxy. Other polymer(s) may be used, if desired. Vacuum may be applied to the interior of a mold to help draw liquid polymer into a desired shape within a mold during formation of component 1726.

One or more surfaces of component 1726 can serve as a reference surface (datum) that helps establish a desired physical relationship between component 1726 and other portions of a device including the display assembly 1704. As an example, component 1726 can be attached to an opposing surface of a housing using a layer of adhesive such as adhesive layer 1728. The shape and location of component 1726 relative to display cover layer 1722, display panel 1724, and other structures in display 1704 may help establish a desired position for display 1704 relative to a device housing. In the example of FIG. 6, component 1726 partly covers tail 1725. If desired, the component 1726 can encapsulate at least a portion of, or all of tail 1725. The upper surface of component 1726 can be molded directly to the underside of display cover layer 1722 to help form an environmental seal. In some examples, however, the display assembly 1704 can include a separate seal that can aid in forming an environmental seal between the display assembly 1704 and a housing.

Figure 7B:
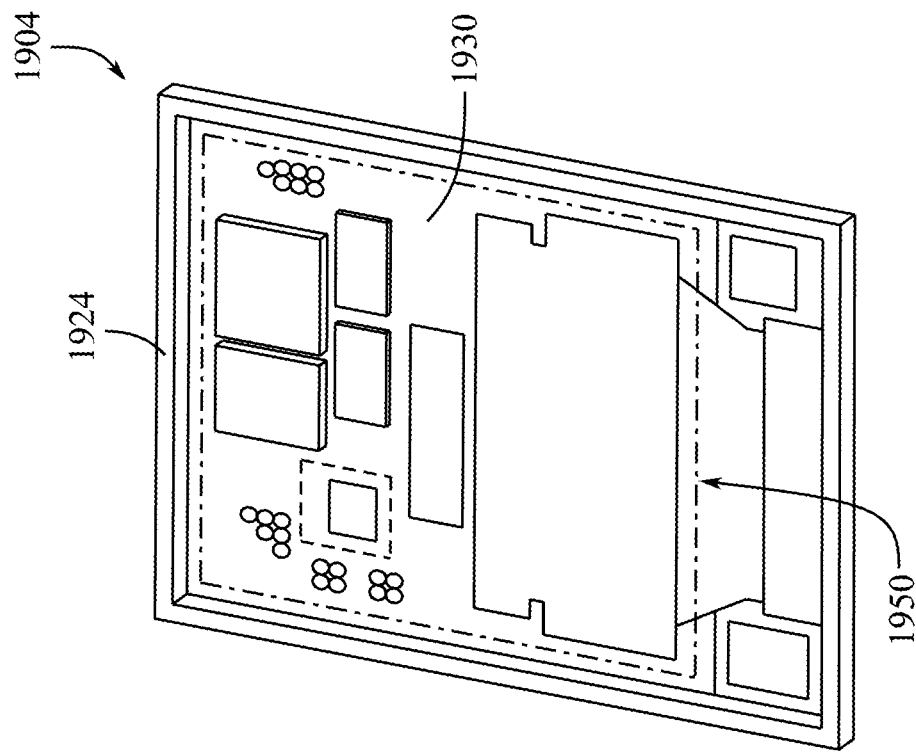
FIG. 7B shows a bottom perspective view of a component of an electronic device.
Figure 7A:
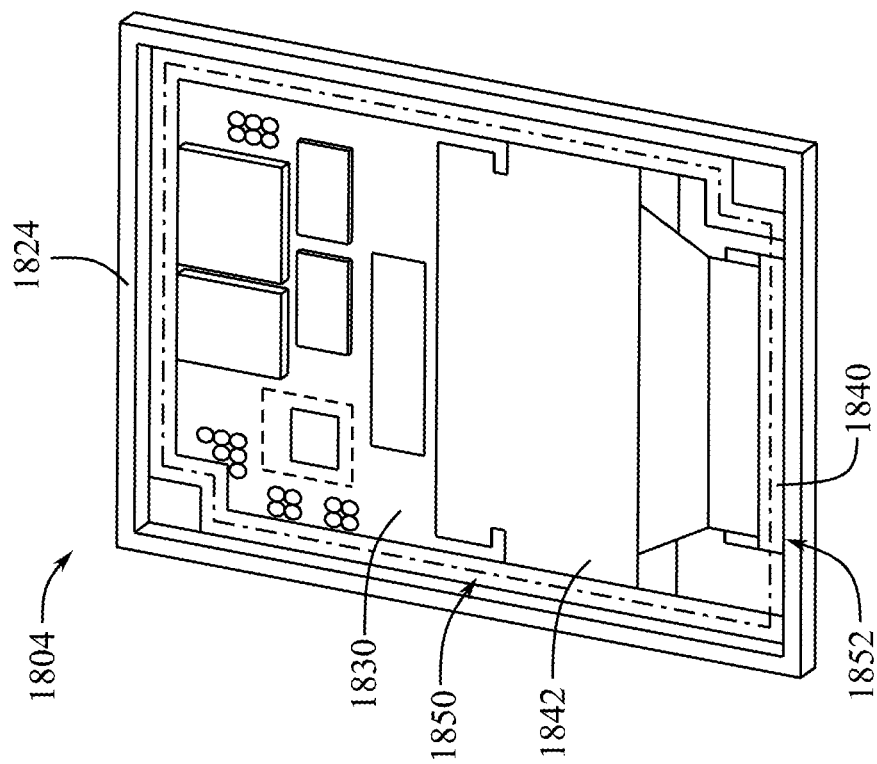
FIG. 7A shows a bottom perspective view of a component of an electronic device.

FIG. 7A shows a bottom perspective view of a display assembly 1804 of an electronic device. As with the display assembly 1704 described with respect to FIG. 6, the display assembly 1804 can include a display layer 1824 that is connected to and overlies a printed circuit board 1830. In some examples, printed circuit board 1830 may be electrically and mechanically attached to a tail of the display layer 1824 using a conductive adhesive such as anisotropic conductive film 1840, which forms electrical connections between contacts on printed circuit board 1830 and mating contacts on the tail. Optional shield 1842 may cover components on printed circuit board 1830 (e.g., display driver integrated circuits).

The display assembly 1804 is shown prior to the incorporation of the molded insulating material which can form a display mounting component, such as the display mounting component 1726. The location of the display mounting component is indicated in FIG. 7A with a dashed line. As can be see, the display mounting component extends around a periphery of the printed circuit board 1830. As the printed circuit board 1830 is smaller than the display layer 1824, the molded insulating material may be adjacent to an edge of the printed circuit board, such as at location 1850. Further, the tail of the display layer 1824 may be offset (e.g., at location 1852) from the surface of the display layer 1824 (e.g., at location 1850), thereby requiring a secondary shut-off at location 1852 in order to seal the mold for the formation of the molded display mounting component.

In some examples, however, and as shown in FIG. 7B, a display assembly 1904 for an electronic device can include a printed circuit board 1930 that has one or more major dimensions, such as a width and/or height, that are substantially similar to the corresponding major dimension of the display layer 1924. By using a printed circuit board 1930 with these dimensional relationships, the tail of the display layer 1924 can be made flush with a major surface of the printed circuit board 1930 (e.g., at location 1950) so that only a single shut-off is needed during the molding operation which can be used to form the display mounting component.

Accordingly, the molded insulating material of the display mounting component, such as display mounting component 1726, can be disposed on a major surface of the printed circuit board 1930 and adjacent to a periphery thereon while also at least partially surrounding the flexible tail of an associated display layer 1924.

Figure 8B:
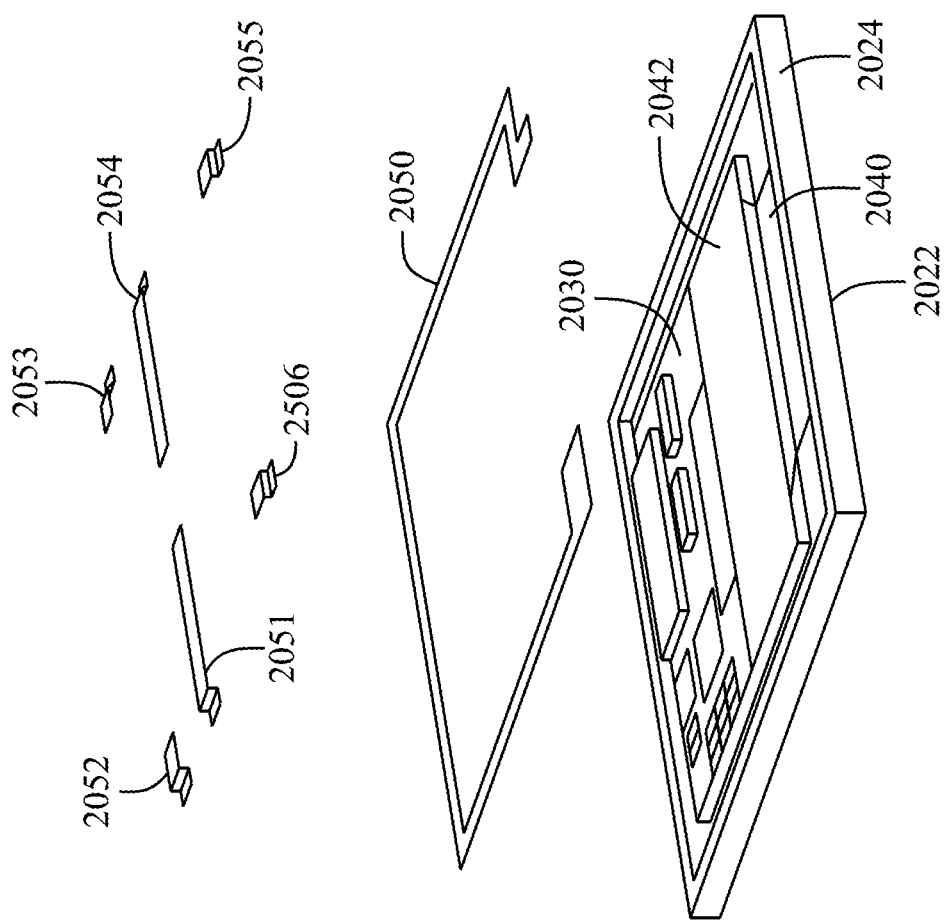
FIG. 8B shows an exploded view of the component of FIG. 8A.
Figure 8A:
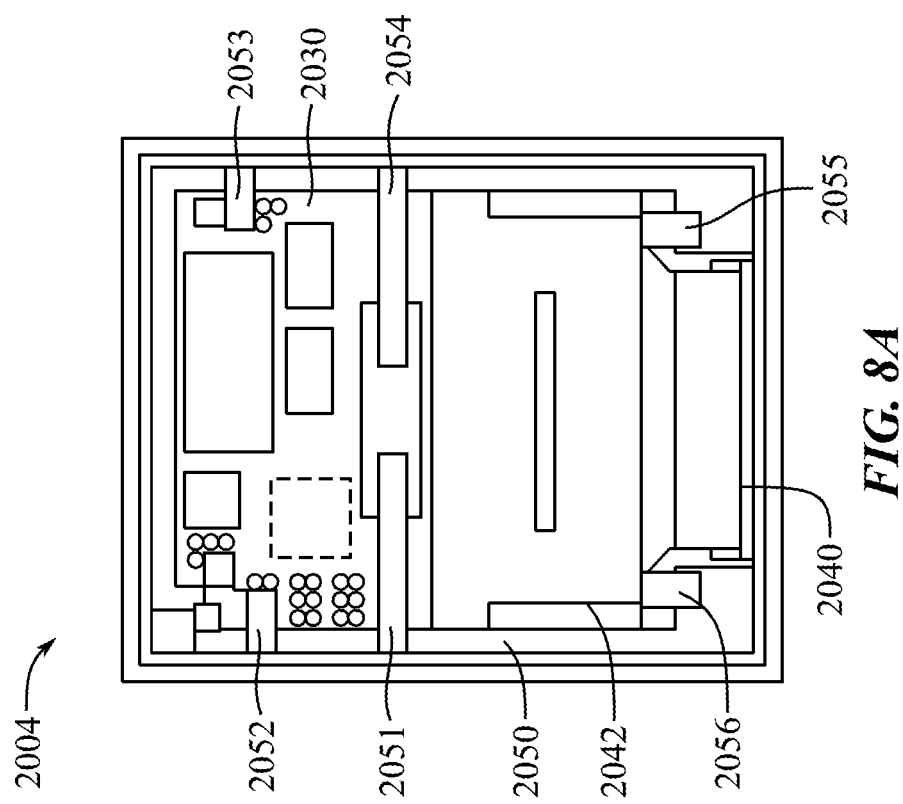
FIG. 8A shows a bottom view of a component of an electronic device.

FIG. 8A shows a bottom view of a display assembly 2004 of an electronic device that can be substantially similar to, and include some or all of the features of the other display assemblies described herein. As with the other display assemblies described herein, the display assembly 2004 can include a printed circuit board 2030 and other components, as well as a conductive adhesive such as anisotropic conductive film 2040 that may be electrically and mechanically attached to a tail of the display layer which forms electrical connections between contacts on printed circuit board 2030 and mating contacts on the tail. The display assembly 2004 can also include a shield 2042 may cover components on printed circuit board 2030 (e.g., display driver integrated circuits).

The display assembly 2004 can also include a conductive layer 2050 that can serve to provide an electrical ground connection between the components of the display assembly, including any antennas and/or resonating elements, and the housing of a device including the display assembly. In some examples, the conductive layer 2050 can include any conductive material as desired and may be, for example, a single or double sided conductive tape. The conductive layer can further be electrically connected to the components of the display assembly 2004 at one or more various locations as desired by additional layers of conductive material, such as portions of conductive tape 2051, 2052, 2053, 2054, 2055, and 2056.

FIG. 8B shows an exploded view of the display assembly 2004 of FIG. 8A, including the display layer 2024 and the transparent cover 2022 to which the printed circuit board 2030 can be coupled. In some examples, the conductive layer 2050 can take any shape as desired, although in some examples it can define an aperture or opening that is shaped to correspond to a peripheral shape of the printed circuit board 2030. Thus, in some examples, the conductive layer 2050 can be disposed adjacent to at least a portion of the periphery of the printed circuit board 2030. Further, in some examples, the conductive layer 2050 can define a gap that can correspond to a size and a location of the display tail of the display layer 2024. As assembled, the display tail, which can connect the display layer 2024 to the printed circuit board 2030, can be at least partially disposed in the gap.

Figure 8C:
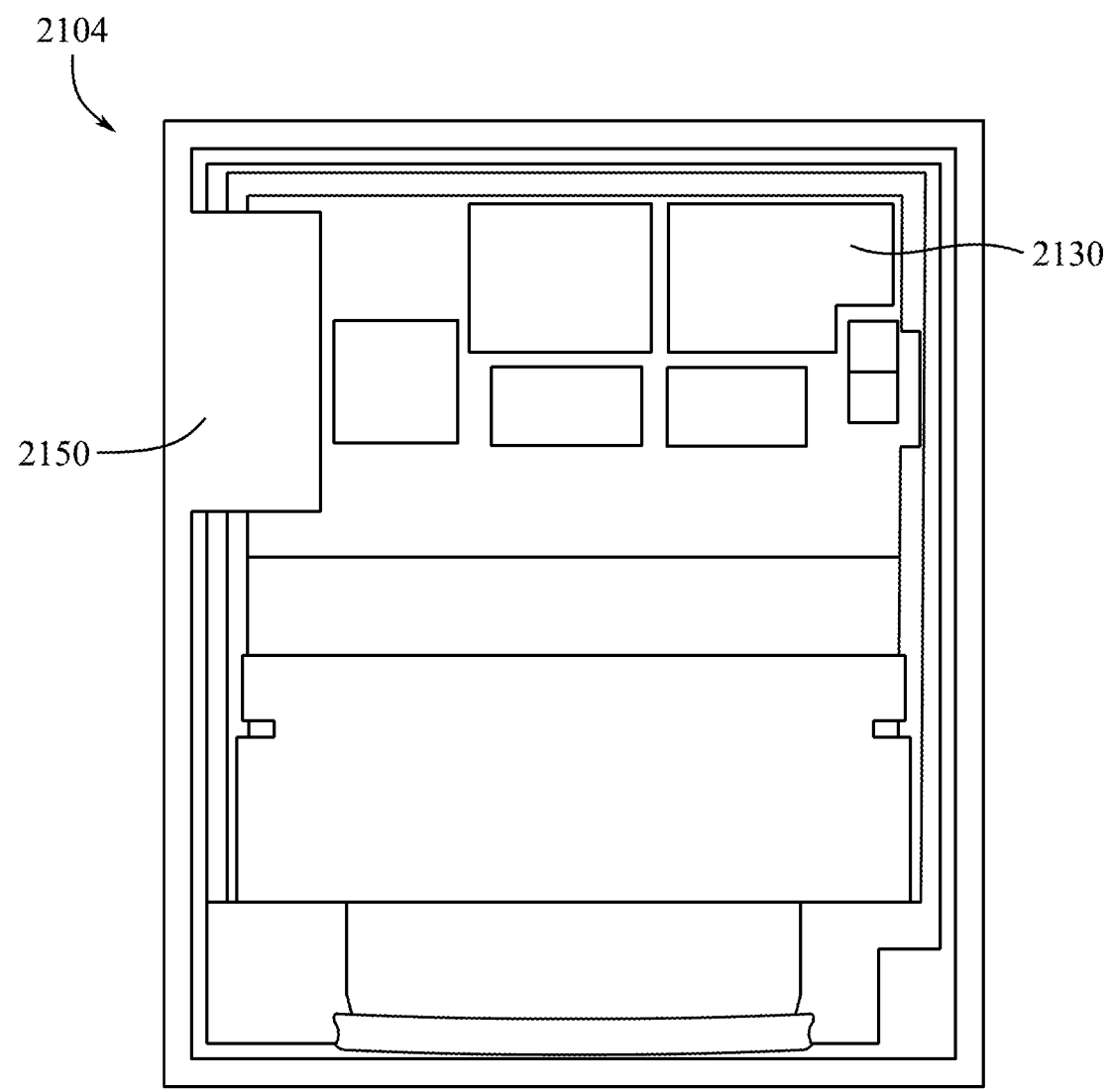
FIG. 8C shows a bottom view of a component of an electronic device.

FIG. 8C shows a bottom view of a display assembly 2104 of an electronic device that can be substantially similar to, and include some or all of the features of the other display assemblies described herein. As with the other display assemblies described herein, the display assembly 2104 can include a printed circuit board 2130 and other components. The display assembly 2104 can also include a conductive grounding layer 2150 that can serve the same purpose as the conductive layer 2050 described herein. In the present example, however, the conductive layer 2150 can include a conductive adhesive disposed adjacent to at least a portion of a periphery of the major surface of the printed circuit board 2130 and electrically connected to the printed circuit board 2130.

Any number or variety of components in any of the configurations described herein can be included in an electronic device, as described herein. The components can include any combination of the features described herein, and can be arranged in any of the various configurations described herein. The structure and arrangement of components of a device, as well as the concepts regarding their use can apply not only to the specific examples discussed herein, but to any number of embodiments in any combination. Various examples of electronic devices and electronic device components including some having various features in various arrangements are described below, with reference to FIGS. 9A-9H.

Figure 9A:
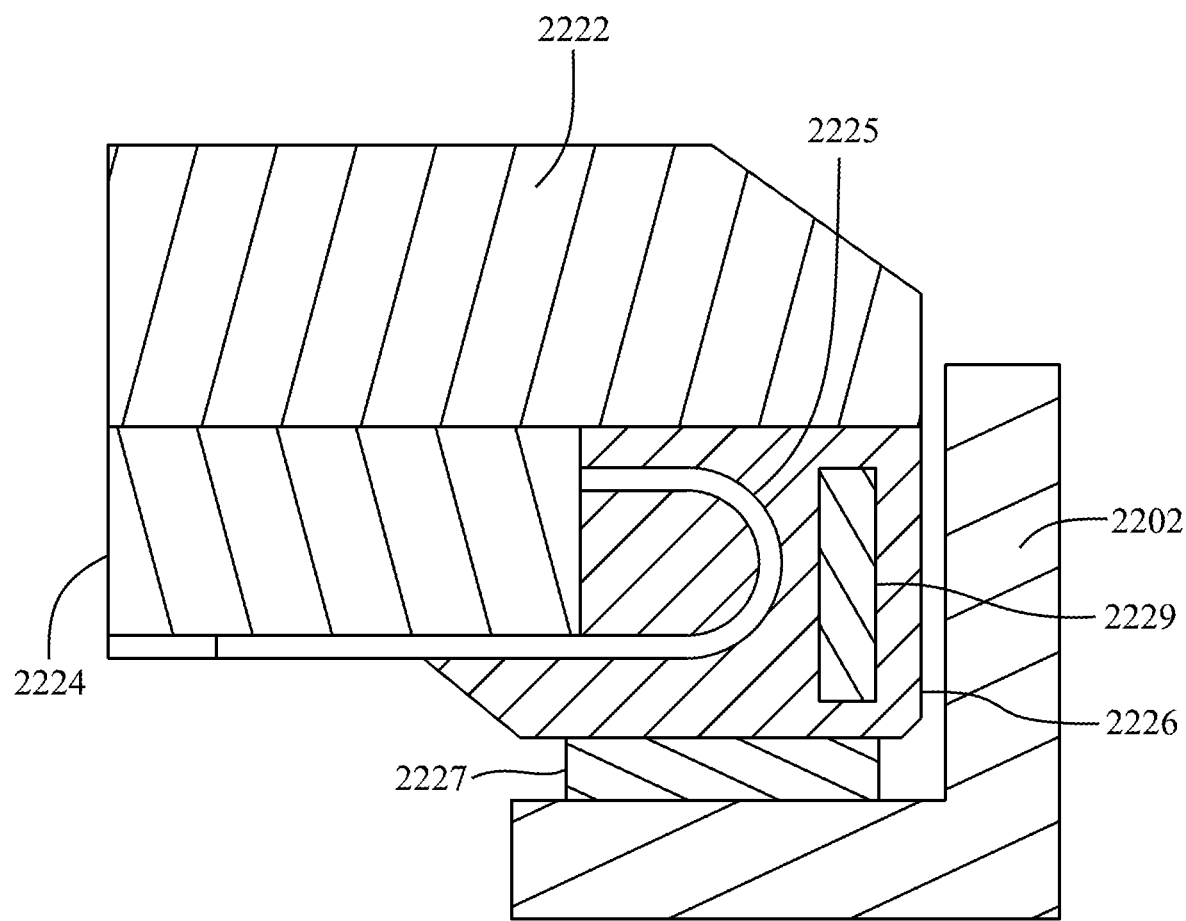
FIG. 9A shows a cross-sectional view of a portion of an electronic device.

FIG. 9A shows a cross-sectional view of a portion of a display assembly taken along the indicated line shown in FIG. 6. As can be seen, the display assembly can include a display layer 2224 and an associated tail 2225 that defines a bend region. A transparent cover 2222 can overlay the display layer 2224. The display assembly can also include a display mounting component 2226 that can at least partially surround or encapsulate the tail 2225 and which can be mounted to a housing 2202 of the electronic device. In the present example, the display mounting component 2226 is secured to the housing 2202 by a layer of adhesive 2227. The adhesive 2227 can include one or more layers of a pressure sensitive adhesive. In some examples, the pressure sensitive adhesive can have a thickness of between 50 microns and 250 microns. In some examples, a component 2229 can be embedded or at least partially surrounded by the display mounting component 2226.

In some examples, the component 2229 can be an electrical component and/or other functional component. For example, the component 2229 can be a part of an antenna assembly, such as a resonating element. In some examples, the component 2229 can serve other functions and/or provide additional or enhanced functionalities. For example, the component 2229 can include a strain gauge that can allow the device to detect an amount of force associated with a touch input by a user on the transparent cover 2222.

Figure 9B:
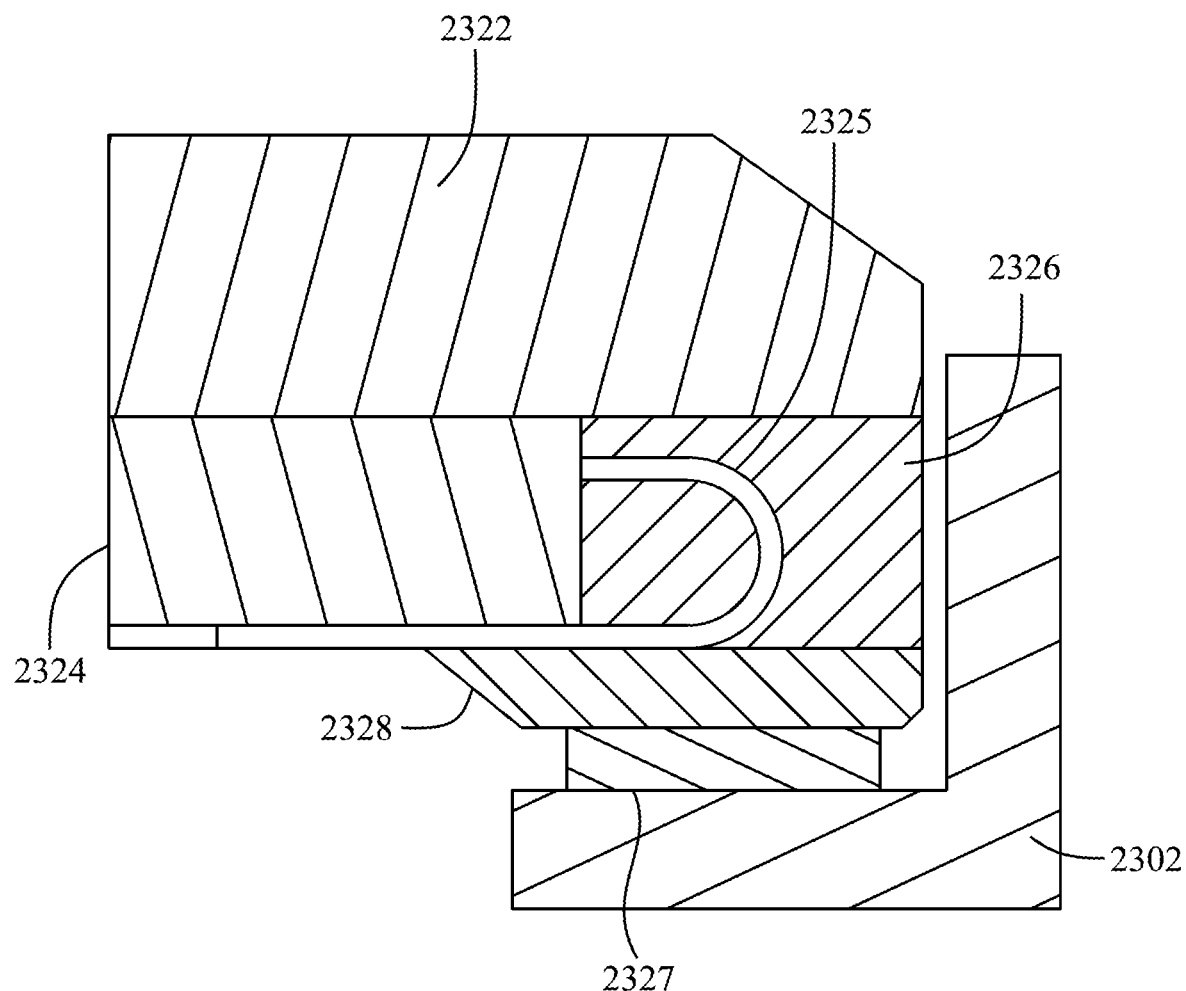
FIG. 9B shows a cross-sectional view of a portion of an electronic device.

FIG. 9B shows a cross-sectional view of a portion of a display assembly taken along the indicated line shown in FIG. 6. As can be seen, the display assembly can include a display layer 2324 and an associated tail 2325 that defines a bend region. A transparent cover 2322 can overlay the display layer 2324. The display assembly can also include a display mounting component that can at least partially surround or encapsulate the tail 2325 and which can be mounted to a housing 2302 of the electronic device, for example, with an adhesive 2327. In the present example, the display mounting component can include two or more portions of material 2326, 2328 and can be formed through a double-shot molding process. In some examples, one portion of material 2326 can be relatively soft and/or pliable, while the second portion 2328 can be harder or more rigid. That is, in some examples, the portion 2328 can have a higher Young's modulus than the portion 2326. Although in some examples, the portion 2328 can have a same or lower Young's modulus. This configuration can reduce intrinsic stresses on the display layer that may be caused by curing the portion 2326, but can also provide a hard layer 2328 that can effectively dissipate energy if the display layer is subjected to a high force event.

Figure 9C:
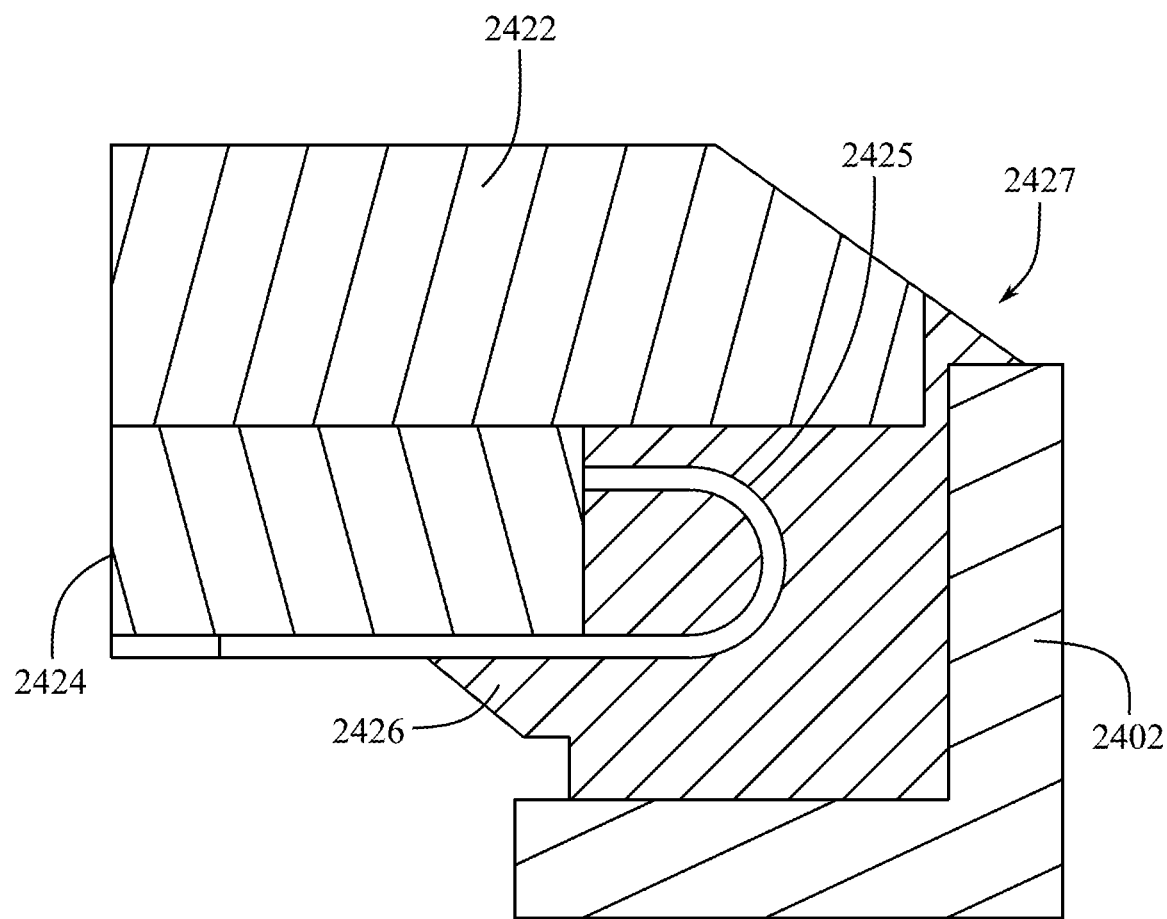
FIG. 9C shows a cross-sectional view of a portion of an electronic device.

FIG. 9C shows a cross-sectional view of a portion of a display assembly taken along the indicated line shown in FIG. 6. As can be seen, the display assembly can include a display layer 2424 and an associated tail 2425 that defines a bend region. A transparent cover 2422 can overlay the display layer 2424. The display assembly can also include a display mounting component 2426 that can at least partially surround or encapsulate the tail 2425 and which can be mounted to a housing 2402 of the electronic device.

In the present example, the molded material of the display mounting component 2426 can also serve to affix the display assembly to the device housing 2402 and/or to provide an environmental seal between the transparent layer 2422 and the device housing. For example, the display mounting component 2426 can at least partially define an exterior surface of the device, such as at location 2427. Thus, in some examples, a portion of the insulating molded material of the display mounting component 2426 that defines the exterior surface of the device can be positioned between the transparent cover 2422 and a sidewall of the housing 2402. Further, as shown, in some examples, the portion of the exterior surface 2427 defined by the display mounting component 2426 can be substantially level, in line with, and/or flush with portion of the exterior surface defined by the housing 2402 and/or transparent cover 2422.

In some examples, this configuration can allow for a reduction in the size of a datum of the housing 2402 associated with the display assembly, while the display mounting component 2426 can serve to dissipate stresses and reduce an amount of stress experienced by the display assembly. Further, the material of the display mounting component 2426 can be chosen to provide a desired cosmetic appearance at location 2427, such as through the inclusion of pigments or dyes in the molded material.

Figure 9D:
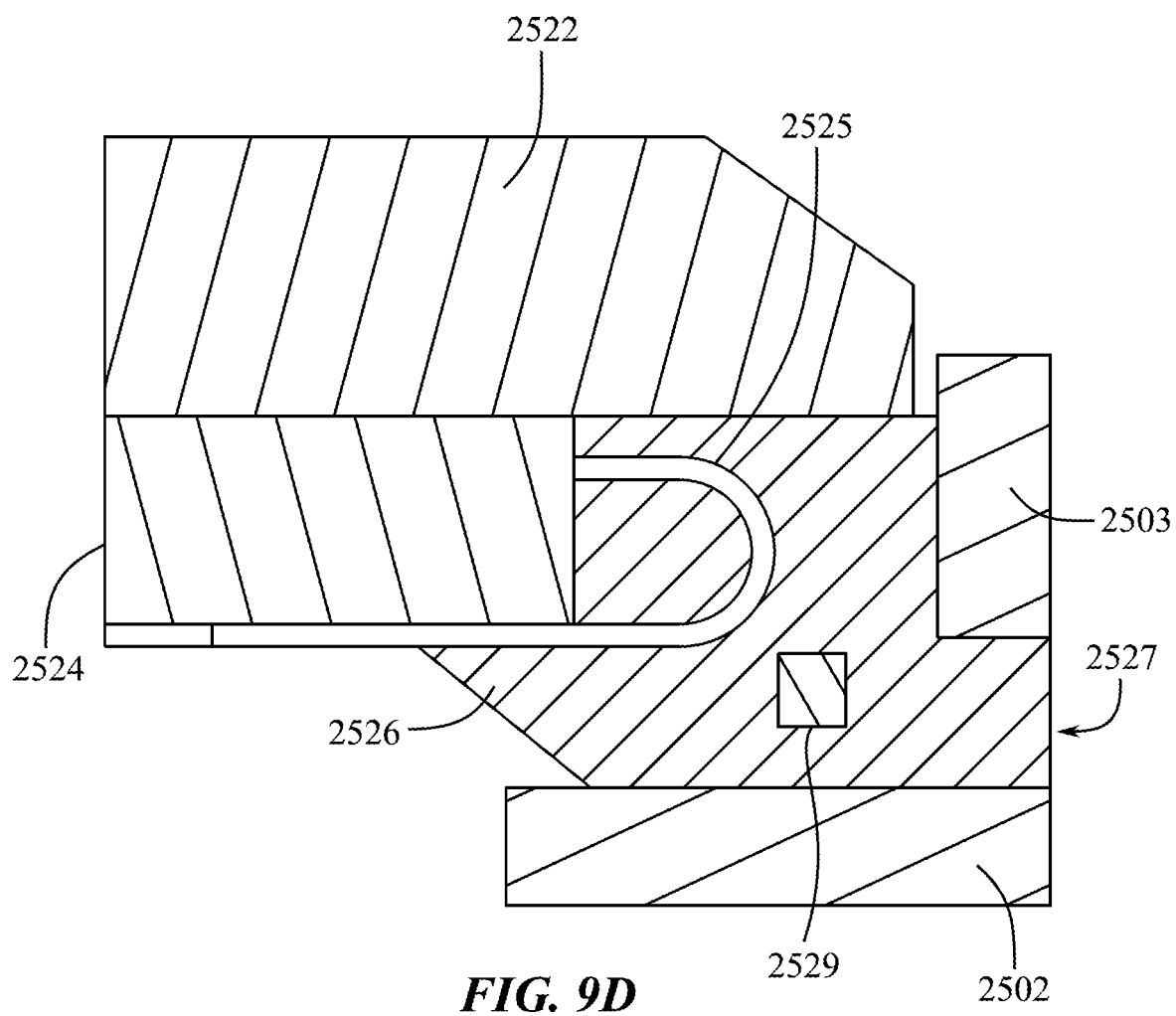
FIG. 9D shows a cross-sectional view of a portion of an electronic device.

FIG. 9D shows a cross-sectional view of a portion of a display assembly taken along the indicated line shown in FIG. 6. As can be seen, the display assembly can include a display layer 2524 and an associated tail 2525 that defines a bend region. A transparent cover 2522 can overlay the display layer 2524. The display assembly can also include a display mounting component 2526 that can at least partially surround or encapsulate the tail 2525 and which can be mounted to a housing of the electronic device. In the present example, the display mounting component 2526 can be directly bonded or adhered to the housing and can at least partially define a portion 2527 of the exterior surface of the device. As shown, in some examples the housing can include a first portion 2502 and a second portion 2503 that together may define a slot of gap therebetween. In some examples, the portions 2502, 2503 may be electrically isolated from one another.

As shown, the molded material of the display mounting component 2526 can be disposed in the gap to define a portion of the exterior surface of the device at location 2527. In some examples, the display mounting component 2526 can thus serve to electrically isolate or insulate the portions 2502, 2503 of the housing from one another. Further, in some examples, a component 2529 can be embedded or at least partially surrounded by the display mounting component 2526. In some examples, the component 2529 can be an electrical component and/or other functional component that can serve other functions and/or provide additional or enhanced functionalities. For example, the molded insulating material of the display mounting component 2526 can be translucent or transparent and the component 2529 can include an environmental sensor, such as an ambient light sensor.

Figure 9E:
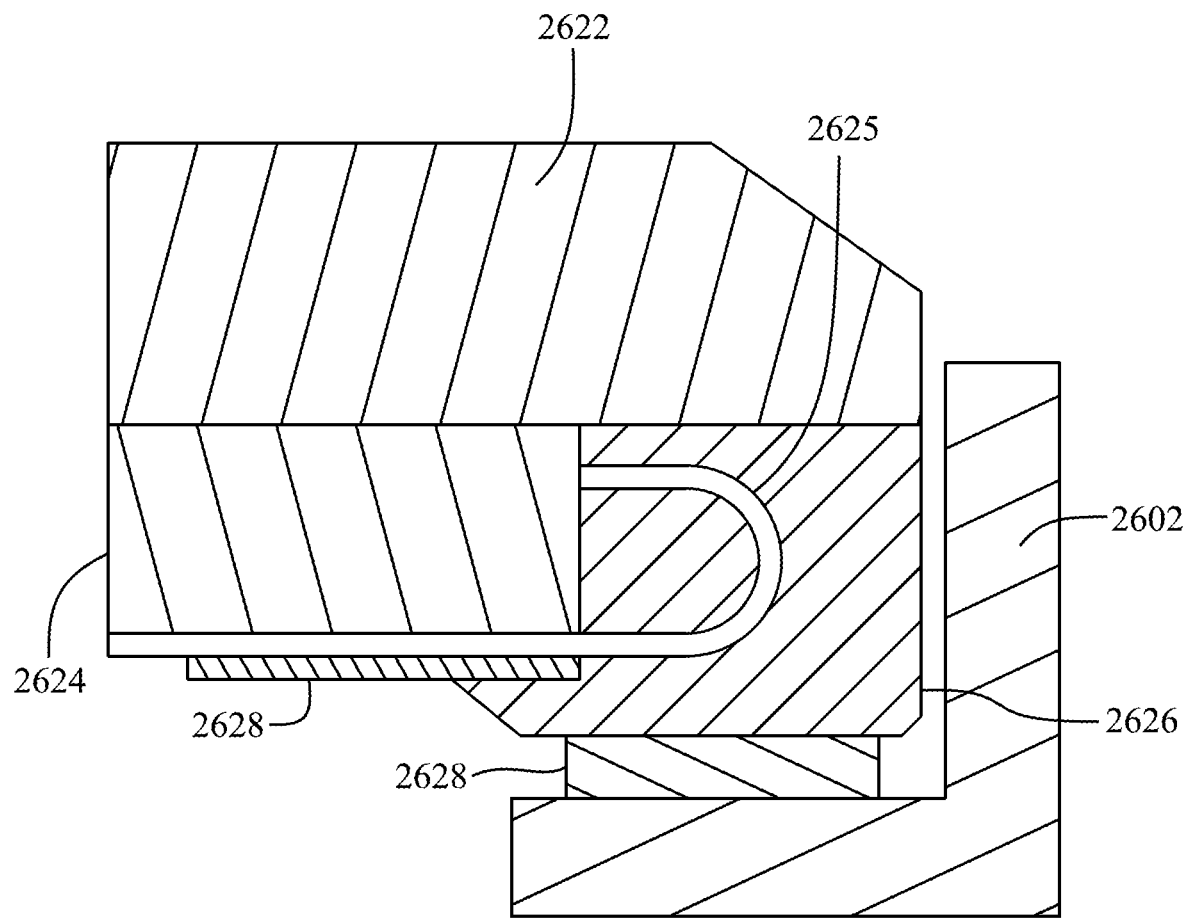
FIG. 9E shows a cross-sectional view of a portion of an electronic device.

FIG. 9E shows a cross-sectional view of a portion of a display assembly taken along the indicated line shown in FIG. 6. As can be seen, the display assembly can include a display layer 2624 and an associated tail 2625 that defines a bend region. A transparent cover 2622 can overlay the display layer 2624. The display assembly can also include a display mounting component 2626 that can at least partially surround or encapsulate the tail 2625 and which can be mounted to a housing 2602 of the electronic device. In some examples, the display assembly can be mounted to the housing 2602 by one or more layers of adhesive 2627. Additionally, in order to increase the stiffness of the display assembly and allow for the transmission of forces exerted thereon to the housing and/or other components without causing undesired amounts of strain to the display assembly, the display assembly can include a stiffener layer 2628.

As can be seen, the stiffener layer 2628 can be disposed under the display layer 2624 and in some examples the stiffener layer can be at least partially embedded in or surrounded by the display mounting component 2626. In some examples, the stiffener layer 2628 can include a relatively high modulus polymer material. In some examples, the stiffener layer 2628 can include PET, silicone, and/or composite materials such as glass or ceramic reinforced polymers, including glass reinforced epoxies.

Figure 9F:
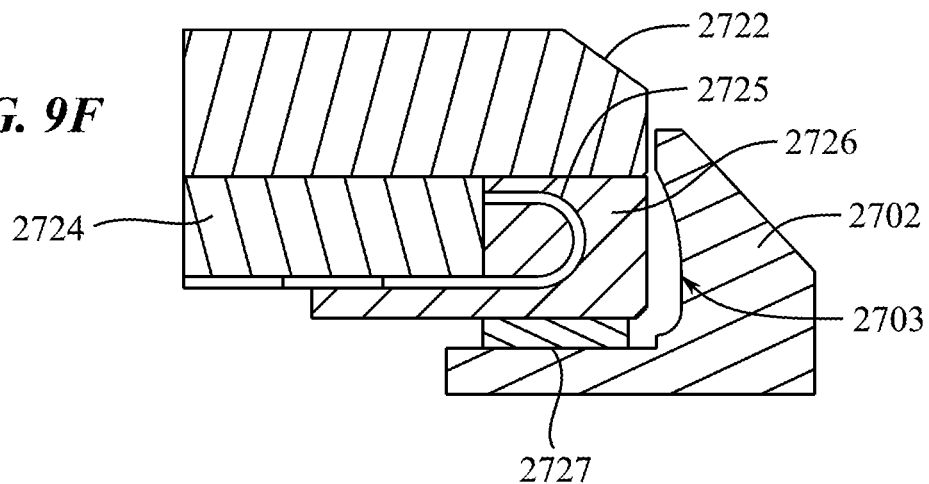
FIG. 9F shows a cross-sectional view of a portion of an electronic device.

FIG. 9F shows a cross-sectional view of a portion of a display assembly taken along the indicated line shown in FIG. 6. As can be seen, the display assembly can include a display layer 2724 and an associated tail 2725 that defines a bend region. A transparent cover 2722 can overlay the display layer 2724. The display assembly can also include a display mounting component 2726 that can at least partially surround or encapsulate the tail 2725 and which can be mounted to a housing 2702 of the electronic device by an adhesive 2727.

In the present example, the housing 2702 can define a recessed or cutout region 2703 that can be disposed adjacent to the display mounting component 2726. The recessed region 2703 can allow for the molded material of the display mounting component 2726 to freely deform into the space of the recessed region 2703 without resistance, thereby allowing the display mounting component 2726 to more effectively dissipate any energy passed into it. For example, during a high stress event, the display mounting component 2726 can deform into the recessed region 2703 to dissipate energy and reduce the strain experienced by the display layer 2724.

Figure 9G:
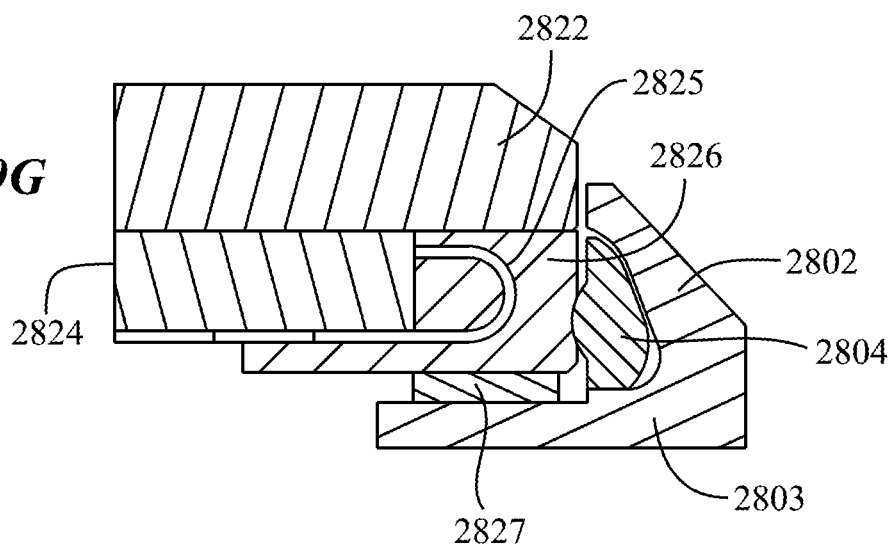
FIG. 9G shows a cross-sectional view of a portion of an electronic device.

FIG. 9G shows a cross-sectional view of a portion of a display assembly taken along the indicated line shown in FIG. 6. As can be seen, the display assembly can include a display layer 2824 and an associated tail 2825 that defines a bend region. A transparent cover 2822 can overlay the display layer 2824. The display assembly can also include a display mounting component 2826 that can at least partially surround or encapsulate the tail 2825 and which can be mounted to a housing 2802 of the electronic device by an adhesive 2827.

As with the housing 2702 of FIG. 9F, the housing 2802 can define a recessed or cutout region 2803 that can be disposed adjacent to the display mounting component 2826. In the present example, however, an energy absorbing component, or bumper 2804 can be positioned in the recessed region 2803 between the housing 2802 and the display mounting component 2826. In some examples, the bumper 2804 can serve to absorb and/or dissipate every transmitted through the display assembly and thus reduce the strain experienced by the display layer 2824.

Figure 9H:
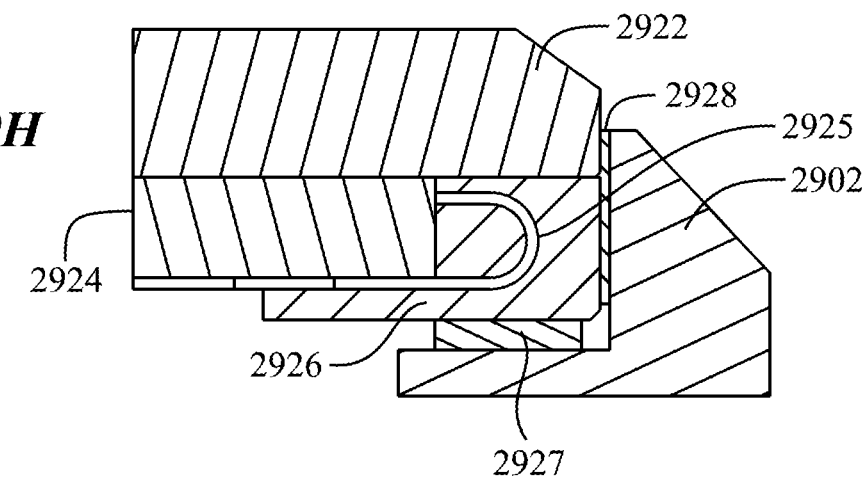
FIG. 9H shows a cross-sectional view of a portion of an electronic device.

FIG. 9H shows a cross-sectional view of a portion of a display assembly taken along the indicated line shown in FIG. 6. As can be seen, the display assembly can include a display layer 2924 and an associated tail 2925 that defines a bend region. A transparent cover 2922 can overlay the display layer 2924. The display assembly can also include a display mounting component 2926 that can at least partially surround or encapsulate the tail 2925 and which can be mounted to a housing 2902 of the electronic device by an adhesive 2927. In addition to the adhesive 2927, the device can also include an additional adhesive layer 2928 disposed between another face or major surface of the display mounting component 2926 and the sidewall of the housing 2902. In some examples, the adhesive 2928 can also be bonded to the transparent cover 2922. The adhesive 2928 can be the same as the adhesive 2926, or can include a different material or materials.

Any number or variety of components in any of the configurations described herein can be included in an electronic device, as described herein. The components can include any combination of the features described herein, and can be arranged in any of the various configurations described herein. The structure and arrangement of components of a device, as well as the concepts regarding their use can apply not only to the specific examples discussed herein, but to any number of embodiments in any combination. Various examples of electronic devices and electronic device components including some having various features in various arrangements are described below, with reference to FIG. 10.

Figure 10:
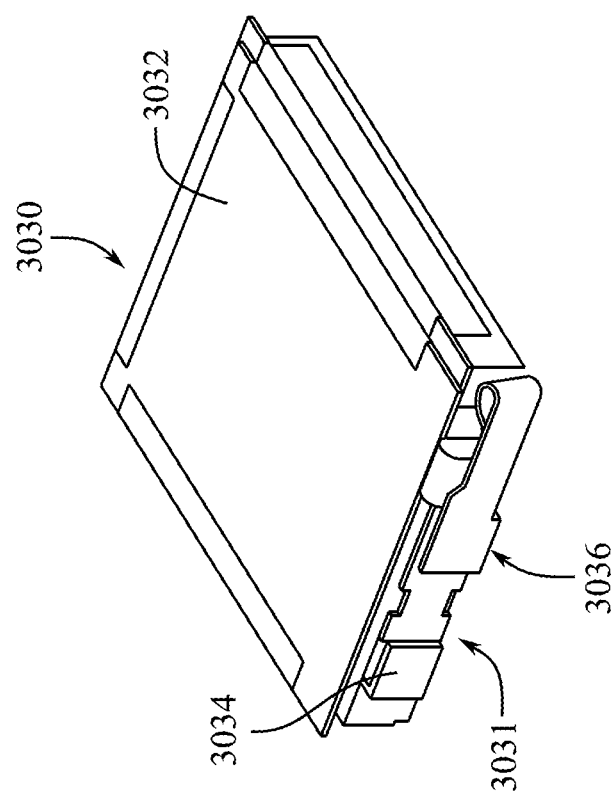
FIG. 10 shows a perspective view of a battery of an electronic device.

FIG. 10 shows a perspective view of a battery 3030 of an electronic device, such as the electronic devices 300, 400, 500 described herein. In some examples, the battery 3030 can include a battery housing 3032 that includes a top portion or wall, a bottom portion or wall (now shown), and sidewalls. The top portion can overhang the sidewalls at one or more locations to define a flange or a shelf that can protrude at least partially beyond a plane defined by a sidewall. Further, in some examples, the battery housing 3032 can include a metallic material, such as sheet metal. In some examples, the sheet metal forming the battery housing 3032 can have a thickness of less than 100 microns, less than 75 microns, or about 50 microns or even less. In some examples, an exterior surface of the battery 3030 defined by the battery housing 3032 can have a matte appearance or finish. That is, in some examples, the exterior surface of the battery housing 3032 can have a blasted, etched, and/or roughened surface.

The battery 3030 can also include one or more operational or electronic components, such as a processor or a controller 3034 and a printed circuit board 3031 on which the controller 3034 can be mounted. In some examples, these components can regulate the power flow between the battery 3030 and other components of the device. In some examples, the electronic components of the battery 3030 can be overmolded or encased with a polymeric material to form a system in package (SiP) 3034 that is in electrical communication with the battery 3030. The overmold material can serve to support the components on a printed circuit board 3031 and can reduce the amount of stress experienced by solder joints between the components and the board, thereby requiring a smaller amount of solder to achieve a reliable electrical connection. Accordingly, a battery 3030 including a SiP 3034 including a processor can have a smaller overall size while maintaining the same electrical capacity as a traditional battery. In at least one example, the processor 3034 can eliminate the need for an additional flexible electronic connector component and thus reduce the number of interconnects within the system and device. In this way, the processor 3034 can reduce losses associated with electrical interconnects.

In some examples, the battery 3030 can be electrically connected to one or more other components of an electronic device by a flexible electrical connector 3036. This flexible electrical connector can provide power and/or signals from the battery 3030 to other components of the device, such as a display and processor. In some examples, the flexible electrical connector can be electrically connected to the printed circuit board 3031 and/or the components thereon by a zero insertion force (ZIF) connector. Accordingly, in some examples, the battery 3030 can transmit power to the rest of the electronic device through the ZIF connector. In some examples, multiple pads and/or pins of the ZIF connector can be combined in order to reduce the impedance of the connection and allow for more efficient transfer of power.

Any of the features or aspects of the devices and components discussed herein can be combined or included in any varied combination. For example, the design and shape of the components or devices is not limited in any way and can be formed by any number of processes, including those discussed herein. As used herein, the terms exterior, outer, interior, and inner are used for reference purposes only. An exterior or outer portion of a composite component can form a portion of an exterior surface of the component, but may not necessarily form the entire exterior of outer surface thereof. Similarly, the interior or inner portion of a composite component can form or define an interior or inner portion of the component, but can also form or define a portion of an exterior or outer surface of the component.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "including."

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A portable electronic device, comprising:
   a housing at least partially defining an internal volume and an exterior surface, the housing including a first portion and a second portion electrically isolated from the first portion;
   a display assembly at least partially disposed in the internal volume, the display assembly comprising:
      a display layer defining an active area;
      a flexible tail comprising a first end portion extending from the display layer and a second end portion connected directly to a printed circuit board, the flexible tail having a bend region between the first end portion and the second end portion; and
      an insulating material at least partially surrounding the display layer, the insulating material including at least a portion of the flexible tail embedded in the insulating material and positioned between the first portion and the second portion; and
   a transparent cover overlaying the display assembly.

2. The portable electronic device of claim 1, further comprising an antenna radiating element at least partially embedded in the insulating material.

3. The portable electronic device of claim 1, wherein the insulating material comprises a first portion and a second portion affixed to the housing, the first portion having a lower Young's modulus than the second portion.

4. The portable electronic device of claim 1, wherein a portion of the insulating material defines the exterior surface and is directly bonded or adhered to the housing.

5. The portable electronic device of claim 1, wherein the insulating material is transparent.

6. The portable electronic device of claim 5, further comprising an ambient light sensor disposed in the insulating material.

7. The portable electronic device of claim 1, wherein the insulating material defines a watertight seal between the display assembly and the housing.

8. The portable electronic device of claim 1, wherein:
   the housing comprises a sidewall that defines a slot between the first portion and the second portion; and
   a portion of the insulating material defines the exterior surface and is disposed in the slot.

9. The portable electronic device of claim 1, wherein a portion of the exterior surface is defined by the insulating material and is adjacent to a portion of the exterior surface defined by the housing.

10. A portable electronic device, comprising:
   a housing having a first housing portion and a second housing portion at least partially defining an internal volume;
   a display assembly at least partially disposed in the internal volume, the display assembly comprising:
      a display layer defining an active area;
      a flexible tail extending from the display layer, the flexible tail having a bend region and a portion extending underneath the display layer adjacent to the bend region; and
      an insulating material at least partially surrounding the display layer and electrically isolating the first housing portion and the second housing portion, the insulating material embedding the flexible tail, including the portion extending underneath the display layer adjacent to the bend region; and
   a transparent cover overlaying the display assembly.

11. The portable electronic device of claim 10, further comprising an energy absorbing component positioned in a recessed region defined by a sidewall of the housing.

12. The portable electronic device of claim 11, wherein the energy absorbing component substantially fills the recessed region.

13. The portable electronic device of claim 10, further comprising an adhesive securing the insulating material to a sidewall of the housing.

* * * * *